United States Patent
Nakasato et al.

(10) Patent No.: US 6,890,831 B2
(45) Date of Patent: May 10, 2005

(54) METHOD OF FABRICATING SEMICONDUCTOR DEVICE

(75) Inventors: Mayumi Nakasato, Ogaki (JP); Makoto Izumi, Mizuho (JP); Kazuhiro Sasada, Hashima (JP); Masahiro Oda, Itami (JP); Toru Dan, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/449,726

(22) Filed: Jun. 2, 2003

(65) Prior Publication Data

US 2004/0009635 A1 Jan. 15, 2004

(30) Foreign Application Priority Data

| | | |
|---|---|---|
| Jun. 3, 2002 | (JP) | 2002-161105 |
| Sep. 27, 2002 | (JP) | 2002-284007 |
| Oct. 9, 2002 | (JP) | 2002-295513 |

(51) Int. Cl.[7] .......................................... H01L 21/762
(52) U.S. Cl. ...................................... 438/424; 438/438
(58) Field of Search .............................. 438/424, 452, 438/770, 773, 774, 294, 296, 438

(56) References Cited

U.S. PATENT DOCUMENTS

| | | | | |
|---|---|---|---|---|
| 4,518,630 A | * | 5/1985 | Grasser | 438/774 |
| 5,851,892 A | * | 12/1998 | Lojek et al. | 438/305 |
| 5,891,809 A | * | 4/1999 | Chau et al. | 438/770 |
| 5,926,741 A | * | 7/1999 | Matsuoka et al. | 438/778 |
| 5,972,779 A | * | 10/1999 | Jang | 438/452 |
| 6,020,247 A | * | 2/2000 | Wilk et al. | 438/398 |
| 6,323,107 B1 | * | 11/2001 | Ueda et al. | 438/435 |
| 6,551,946 B1 | * | 4/2003 | Chen et al. | 438/770 |
| 6,670,242 B1 | * | 12/2003 | Brady et al. | 438/261 |

FOREIGN PATENT DOCUMENTS

| | | |
|---|---|---|
| JP | 7-147257 A | 6/1995 |
| JP | 08-191067 | 7/1996 |
| JP | 10-125807 | 5/1998 |
| JP | 10-326777 | 12/1998 |
| JP | 2000-101071 A | 4/2000 |
| JP | 2000-150870 | 5/2000 |
| JP | 2000-223488 | 8/2000 |
| JP | 2000-269496 A | 9/2000 |
| JP | 2000-323473 A | 11/2000 |
| JP | 2001-93901 A | 4/2001 |
| JP | 2000-290163 A | 4/2002 |
| JP | 2003-188377 A | 7/2003 |
| JP | 2004-064036 A | 2/2004 |

OTHER PUBLICATIONS

Chang, et al. "Enabling Shallow Trench Isolation for 0.1$\mu$m Technologies and Beyond" 1999 Symposium on VLSI Technology: Digest of Technical Papers, (Jun. 14–16, 1999).

* cited by examiner

Primary Examiner—Carl Whitehead, Jr.
Assistant Examiner—Jennifer M. Dolan
(74) Attorney, Agent, or Firm—McDermott Will & Emery LLP

(57) ABSTRACT

A method of fabricating a semiconductor device capable of improving reliability of a gate insulator film is obtained. This method of fabricating a semiconductor device comprises a step of forming a gate insulator film on the main surface of a semiconductor layer by heat treatment, and the step of forming the gate insulator film includes a step of performing the heat treatment in an atmosphere containing oxidizing gas at a temperature exceeding the temperature causing viscous flow of the gate insulator film thereby forming the gate insulator film on the main surface of the semiconductor layer.

15 Claims, 12 Drawing Sheets

METHOD OF FABRICATING SEMICONDUCTOR DEVICE

BACKGROUND OF THE INVENTION

1. Field of the Invention

The present invention relates to a method of fabricating a semiconductor device, and more particularly, it relates to a method of fabricating a semiconductor device having an insulator film such as a gate insulator film.

2. Description of the Background Art

Following the recently increased density and degree of integration of an ULSI (ultra large scale integrated circuit), elements thereof are also refined. In order to refine the elements, it is important to refine an element isolation region simultaneously with refinement of the elements themselves. Therefore, various methods are proposed for refining the element isolation region. In particular, STI (shallow trench isolation) is proposed in place of the conventional LOCOS (local oxidation of silicon) method.

In a semiconductor device including a MOS transistor, a gate insulator film is formed on the surface of an element forming region of a semiconductor substrate enclosed with an element isolation region. This gate insulator film is generally prepared from a silicon oxide film formed by heat-treating a silicon substrate in an oxidizing atmosphere or a silicon oxynitride film formed by heat-treating the silicon substrate in an oxidizing atmosphere containing nitrogen atoms. In this case, the gate insulator film is generally formed by performing heat treatment at a temperature of about 700° C. to about 850° C. with a low oxidizing velocity in order to excellently control the thickness thereof, as disclosed in Japanese Patent Laying-Open No. 2000-223488, for example. Japanese Patent Laying-Open No. 2000-223488 discloses a technique of forming a gate insulator film by performing oxidation at a temperature of not more than 850° C.

FIGS. 15 to 23 are sectional views for illustrating a conventional fabrication process for a semiconductor device including a MOS transistor. FIG. 24 is a sequence diagram showing conditions for forming a gate insulator film of the conventional MOS transistor. The conventional fabrication process for a semiconductor device is now described with reference to FIGS. 15 to 24.

First, pad oxide films 102 consisting of silicon oxide and silicon nitride films 103 are successively deposited on a silicon substrate 101 and thereafter patterned, as shown in FIG. 15. Thereafter the pad oxide films 102 and the silicon nitride films 103 are employed as masks for etching portions of the silicon substrate 101 for defining element isolation regions, thereby forming trenches (element isolation trenches) 150.

As shown in FIG. 16, heat treatment is performed at a temperature of about 1000° C. to about 1200° C., thereby forming liner oxide films 104 consisting of silicon oxide on the surfaces of the element isolation trenches 150.

As shown in FIG. 17, silicon oxide films 105 are deposited by high-density plasma CVD to fill up the element isolation trenches 150. Thereafter the silicon oxide films 105 are polished/partially removed by CMP (chemical mechanical polishing) through the silicon nitride films 103 serving as stoppers, to be flattened as shown in FIG. 18.

Then, the silicon nitride films 103 are removed by wet etching with phosphoric acid and the pad oxide films 102 are thereafter removed by wet etching with dilute hydrofluoric acid thereby exposing active regions (element forming regions) of the silicon substrate 101, as shown in FIG. 19. When the pad oxide films 102 are removed by wet etching, the upper surfaces and the side surfaces of the silicon oxide films 105 are also etched to some extent. Thus, element isolation films consisting of the silicon oxide films 105 are embedded in the element isolation trenches 150, thereby forming the element isolation regions.

Then, sacrifice oxide films 106 consisting of silicon oxide are formed on the surfaces of the exposed element forming regions, as shown in FIG. 20. An n-type impurity and a p-type impurity are ion-implanted from above the silicon substrate 101 through the sacrifice oxide films 106 respectively, thereby forming an n-type well region 111 and a p-type well region 112. Thereafter the sacrifice oxide films 106 are removed with dilute hydrofluoric acid, thereby exposing the element forming regions of the silicon substrate 101 as shown in FIG. 21.

Then, gate insulator films 107 consisting of silicon oxide are formed on the surfaces of the exposed element forming regions of the silicon substrate 101 by thermal oxidation at a temperature of about 750° C., as shown in FIG. 22. More specifically, temperature increase and temperature reduction steps are carried out in an $N_2$ gas atmosphere while heat treatment is performed in a wet oxidizing atmosphere containing about 50 vol. % of $O_2$ gas and about 50 vol. % of $H_2$ gas respectively under a temperature condition of about 750° C. as shown in FIG. 24, thereby forming the gate insulator films 107 consisting of silicon oxide.

Finally, gate electrodes 108 of polysilicon are formed on the silicon oxide films 105 to come into contact with the upper surfaces of the gate insulator films 107, as shown in FIG. 23. The gate electrodes 108 are employed as masks for ion-implanting impurities, thereby forming a source region (not shown) and a drain region (not shown) in the n-type well region 111 and the p-type well region 112 respectively. An interlayer dielectric film 109 consisting of silicon oxide or silicon nitride is formed to cover the overall surface, and contact holes 109a are thereafter formed in prescribed regions of the interlayer dielectric film 109. Electrodes 110 consisting of an aluminum alloy are formed to be electrically connected with the source region, the drain region and the gate electrodes 108 respectively through the contact holes 109a. Thus, the conventional semiconductor device including a MOS transistor is completed.

In the aforementioned conventional method of fabricating a semiconductor device, oxygen atoms enter between silicon atoms on the interface between the liner oxide films 104 and the silicon substrate 101 in the step of forming the liner oxide films 104 consisting of silicon oxide shown in FIG. 16, to result in cubical expansion. On the interface between the silicon substrate 101 and the liner oxide films 104, therefore, internal stress results from this cubical expansion. Particularly on upper corners 150a of the element isolation trenches 150, upward cubical expansion is inhibited due to the presence of the silicon nitride films 103 serving as oxidation-resistant masks, to result in strong stress. In general, the gate insulator films 107 are formed to cover the upper corners 150a of the element isolation trenches 150, subjected to the strong stress, in the later step of forming the gate insulator films 107 (see FIG. 22). In this case, the gate insulator films 107 consisting of silicon oxide are formed at the low temperature of about 750° C. (about 700° C. to about 850° C.) in the conventional fabrication method, and hence it is difficult to release the upper corners 150a of the element isolation trenches 150 from the strong stress in formation of the gate insulator films 107. Therefore, the gate insulator films 107 formed to cover the upper corner portions 150a of the element isolation trenches 150 subjected to the strong stress are disadvantageously reduced in reliability. In particular, the gate insulator films 107 are reduced in time dependent dielectric breakdown (TDDB) serving as the measure for evaluating the reliability of the gate insulator films 107.

SUMMARY OF THE INVENTION

An object of the present invention is to provide a method of fabricating a semiconductor device capable of improving reliability of an insulator film such as a gate insulator film or suppressing reduction of the reliability.

In order to attain the aforementioned object, a method of fabricating a semiconductor device according to a first aspect of the present invention comprises a step of forming a gate insulator film on the main surface of a semiconductor layer by heat treatment, and the step of forming the gate insulator film includes a step of performing the heat treatment in an atmosphere containing oxidizing gas at a temperature exceeding the temperature causing viscous flow of the gate insulator film thereby forming the gate insulator film on the main surface of the semiconductor layer. Throughout the specification, the term "semiconductor layer" denotes a wide concept including not only an ordinary semiconductor layer but also a semiconductor substrate.

In the method of fabricating a semiconductor device according to the first aspect, the heat treatment is performed in the atmosphere containing oxidizing gas at the temperature exceeding that causing viscous flow of the gate insulator film thereby forming the gate insulator film on the main surface of the semiconductor layer as hereinabove described, whereby the gate insulator film becomes viscoelastic and can viscously flow (move) to release internal stress resulting from element isolation, for example. Thus, the internal stress resulting from element isolation can be so relaxed that reliability of the gate insulator film can be improved.

In the aforementioned method of fabricating a semiconductor device according to the first aspect, the step of forming the gate insulator film preferably includes steps of performing first heat treatment on the main surface of the semiconductor layer in an atmosphere containing oxidizing gas at a temperature less than the temperature causing viscous flow of the gate insulator film and performing second heat treatment in an atmosphere containing oxidizing gas at a temperature exceeding the temperature causing viscous flow of the gate insulator film after the first heat treatment. According to this structure, the gate insulator film is partially formed in advance of the second heat treatment performed at a high temperature due to the first heat treatment performed at a low temperature, whereby an impurity contained in a well region (channel region) can be inhibited from diffusing outward from an exposed surface portion of the semiconductor substrate in the second heat treatment performed at a high temperature. Thus, it is possible to suppress such an inconvenience that the threshold voltage of the device is dispersed due to heterogeneous impurity concentration resulting from out diffusion of the impurity contained in the well region (channel region), whereby stable element characteristics can be obtained. The gate insulator film is partially formed by the first heat treatment performed at a low temperature with a low oxidizing velocity so that thickness controllability can be improved as compared with a case of forming the entire gate insulator film at a high temperature exceeding the temperature causing viscous flow of the gate insulator film with a high oxidizing velocity. Further, the second heat treatment is performed at the temperature exceeding that causing viscous flow of the gate insulator film after performing the first heat treatment at the temperature less than that causing viscous flow of the gate insulator film, whereby it is possible to avoid slip dislocation easily caused around the wafer when the second heat treatment is performed by increasing the temperature to a level exceeding that causing viscous flow of the gate insulator film at one fling.

The aforementioned method of fabricating a semiconductor device according to the first aspect preferably further comprises steps of forming an element isolation trench on the main surface of the semiconductor layer, oxidizing the surface of the element isolation trench thereby forming an oxide film and forming an insulator to fill up the element isolation trench formed with the oxide film in advance of formation of the gate insulator film, and the step of forming the gate insulator film preferably includes a step of forming the gate insulator film on a portion of the main surface of the semiconductor layer exposed in the vicinity of an upper corner of the element isolation trench. According to this structure, stress caused in the vicinity of the upper corner of the element isolation trench when the oxide film is formed on the surface of the element isolation trench can be easily relaxed by viscous flow of the gate insulator film.

In the aforementioned method of fabricating a semiconductor device according to the first aspect, the temperature exceeding the temperature causing viscous flow of the gate insulator film is preferably at least about 1000° C. When the gate insulator film is formed at the temperature of at least about 1000° C., the gate insulator film can easily viscously flow.

A method of fabricating a semiconductor device according to a second aspect of the present invention comprises a step of forming a gate insulator film on the main surface of a semiconductor layer by heat treatment, and the step of forming the gate insulator film includes steps of performing first heat treatment on the main surface of the semiconductor layer in an atmosphere containing oxidizing gas at a temperature less than the temperature causing viscous flow of the gate insulator film and performing second heat treatment in an atmosphere containing oxidizing gas at a temperature exceeding the temperature causing viscous flow of the gate insulator film after the first heat treatment.

In the method of fabricating a semiconductor device according to the second aspect, the second heat treatment is performed at the temperature exceeding that causing viscous flow of the gate insulator film after performing the first heat treatment at the temperature less than that causing viscous flow of the gate insulator film as hereinabove described so that the gate insulator film is partially formed in advance of the second heat treatment performed at a high temperature due to the first heat treatment performed at a low temperature, whereby an impurity contained in a well region (channel region) can be inhibited from diffusing outward from an exposed surface portion of the semiconductor substrate in the second heat treatment performed at a high temperature. Thus, it is possible to suppress such an inconvenience that the threshold voltage of the device is dispersed due to heterogeneous impurity concentration resulting from out diffusion of the impurity contained in the well region (channel region), whereby stable element characteristics can be obtained. The gate insulator film is partially formed by the first heat treatment performed at a low temperature with a low oxidizing velocity so that thickness controllability can be improved as compared with a case of forming the entire gate insulator film at a high temperature exceeding the temperature causing viscous flow of the gate insulator film with a high oxidizing velocity. Further, the second heat treatment is performed at the temperature exceeding that causing viscous flow of the gate insulator film after performing the first heat treatment at the temperature less than that causing viscous flow of the gate insulator film, whereby it is possible to avoid slip dislocation easily caused around the wafer when the second heat treatment is performed by increasing the temperature to a level exceeding that causing viscous flow of the gate insulator film at one fling.

According to the second aspect, further, the second heat treatment is performed in the atmosphere containing oxidizing gas at the temperature exceeding that causing viscous flow of the gate insulator film as hereinabove described, whereby the gate insulator film becomes viscoelastic and can viscously flow (move) to release internal stress resulting from element isolation, for example. Thus, the internal stress resulting from element isolation can be so relaxed that reliability of the gate insulator film can be improved.

In the aforementioned method of fabricating a semiconductor device according to the second aspect, the step of forming the gate insulator film preferably includes a step of forming a portion having a first thickness less than half the thickness of the gate insulator film by the first heat treatment and thereafter forming a portion having a second thickness larger than half the thickness of the gate insulator film by the second heat treatment. According to this structure, the time for the second heat treatment performed at the temperature exceeding that causing viscous flow of the gate insulator film is so increased that an effect of relaxing stress by viscous flow can be increased.

In the aforementioned method of fabricating a semiconductor device according to the second aspect, the step of forming the gate insulator film may include a step of forming a portion having a third thickness larger than half the thickness of the gate insulator film by the first heat treatment and thereafter forming a portion having a fourth thickness less than half the thickness of the gate insulator film by the second heat treatment. According to this structure, the time for the second heat treatment performed at a high oxidizing velocity can be so reduced that thickness controllability for the gate insulator film can be further improved. Further, the time for the second heat treatment performed at a high temperature can be so reduced that the impurity can be further inhibited from out diffusion.

The aforementioned method of fabricating a semiconductor device according to the second aspect preferably further comprises a step of exposing the surface of the semiconductor layer in advance of the step of forming the gate insulator film, for forming the gate insulator film with a thickness of not more than 2.5 nm by carrying out the steps of exposing the surface of the semiconductor layer and forming the gate insulator film in a vacuum. According to this structure, it is possible to prevent the surface of the semiconductor layer from formation of a native oxide film after exposing the surface of the semiconductor layer and before forming the gate insulator film, whereby the gate insulator film can be easily formed with a small thickness of not more than 2.5 nm.

The aforementioned method of fabricating a semiconductor device according to the second aspect preferably further comprises steps of forming an element isolation trench on the main surface of the semiconductor layer, oxidizing the surface of the element isolation trench thereby forming an oxide film and forming an insulator to fill up the element isolation trench formed with the oxide film in advance of formation of the gate insulator film, and the step of forming the gate insulator film preferably includes a step of forming the gate insulator film on a portion of the main surface of the semiconductor layer exposed in the vicinity of an upper corner of the element isolation trench. According to this structure, stress caused in the vicinity of the upper corner of the element isolation trench when the oxide film is formed on the surface of the element isolation trench can be easily relaxed by viscous flow of the gate insulator film.

The aforementioned method of fabricating a semiconductor device according to the second aspect preferably further comprises a step of increasing the temperature stepwise from the temperature less than the temperature causing viscous flow of the gate insulator film employed in the first heat treatment to the temperature exceeding the temperature causing viscous flow of the gate insulator film for performing the second heat treatment in a non-oxidizing atmosphere after the first heat treatment. According to this structure, it is possible to more effectively avoid slip dislocation easily caused around the wafer when the second heat treatment is performed by increasing the temperature to a level exceeding that causing viscous flow of the gate insulator film at one fling.

In the aforementioned method of fabricating a semiconductor device according to the second aspect, the content of the oxidizing gas in the second heat treatment is preferably smaller than the content of the oxidizing gas in the first heat treatment. According to this structure, the easily increased oxidizing velocity in the high-temperature second heat treatment can be so retarded that thickness controllability for the gate insulator film can be further improved.

In the aforementioned method of fabricating a semiconductor device according to the second aspect, the step of performing the first treatment preferably includes a step of oxidizing the main surface of the semiconductor layer by the first heat treatment while heating the main surface of the semiconductor layer under the atmosphere containing the oxidizing gas at a temperature less than the temperature causing viscous flow of the gate insulator film. According to this structure, the heating step and the step of oxidizing the main surface of the semiconductor layer by the first heat treatment can be simultaneously carried out, whereby the time for the oxidation process can be reduced.

In the aforementioned method of fabricating a semiconductor device according to the second aspect, the step of performing the second heat treatment preferably includes a step of oxidizing the main surface of the semiconductor layer by the second heat treatment while heating the main surface of the semiconductor layer under the atmosphere containing the oxidizing gas at a temperature exceeding the temperature causing viscous flow of the gate insulator film. According to this structure, the heating step and the step of oxidizing the main surface of the semiconductor layer by the second heat treatment can be simultaneously carried out, whereby the time for the oxidation process can be reduced. When claims 9 and 10 are combined with each other, the heating step and the steps of oxidizing the main surface of the semiconductor layer by the first heat treatment and the second heat treatment can be simultaneously carried out, whereby the time for the oxidation process can be further reduced.

In the aforementioned method of fabricating a semiconductor device according to the second aspect, the step of performing the first heat treatment preferably includes a step of oxidizing the main surface of the semiconductor layer by the first heat treatment while heating the main surface of the semiconductor layer under the atmosphere containing the oxidizing gas at a temperature less than the temperature causing viscous flow of the gate insulator film, and the step of performing the second heat treatment preferably includes a step of oxidizing the main surface of the semiconductor layer by the second heat treatment while heating the main surface of the semiconductor layer under the atmosphere containing the oxidizing gas at a temperature exceeding the temperature causing viscous flow of the gate insulator film. According to this structure, the heating step and the steps of oxidizing the main surface of the semiconductor layer by the first heat treatment and the second heat treatment can be simultaneously carried out, whereby the time for the oxidation process can be further reduced.

In the aforementioned method of fabricating a semiconductor device according to the second aspect, the temperature exceeding the temperature causing viscous flow of the gate insulator film is preferably at least about 1000° C. When the gate insulator film is formed at the temperature of at least about 1000° C., the gate insulator film can easily viscously flow.

A method of fabricating a semiconductor device according to a third aspect of the present invention comprises a step of forming an insulator film on the main surface of a semiconductor layer by heat treatment, and the step of forming the insulator film includes steps of performing first heat treatment on the main surface of the semiconductor layer in an atmosphere containing oxidizing gas at a temperature less than the temperature causing viscous flow of the insulator film and performing second heat treatment in an atmosphere containing oxidizing gas at a temperature exceeding the temperature causing viscous flow of the insulator film after the first heat treatment.

In the method of fabricating a semiconductor device according to the third aspect, the second heat treatment is performed at the temperature exceeding that causing viscous flow of the gate insulator film after performing the first heat treatment at the temperature less than that causing viscous flow of the gate insulator film as hereinabove described, so that the insulator film is partially formed in advance of the second heat treatment performed at a high temperature due to the first heat treatment performed at a low temperature. Therefore, when an upper corner of an element isolation trench is exposed, for example, the surface of the exposed upper corner of the element isolation trench can be inhibited from irregularization in the second heat treatment performed at a high temperature. It is known that the surface of a substrate is irregularized if the same is heated to a high temperature in an atmosphere with lean oxygen in an exposed state or a state formed with a native oxide film of not more than 1 nm in thickness. According to the third aspect of the present invention, the insulator film is previously partially formed by the first heat treatment performed at a low temperature, whereby the surface of the upper corner of the element isolation trench can be inhibited from irregularization. Consequently, the insulator film formed on the surface of the upper corner can be inhibited from reduction of reliability resulting from irregularization of the surface of the upper corner. Further, the second heat treatment is performed at the temperature exceeding that causing viscous flow of the insulator film. Therefore, when the semiconductor device has an element isolation trench, for example, stress caused in the vicinity of an upper corner of this element isolation trench can be relaxed by viscous flow of the insulator film. Thus, the insulator film can be inhibited from reduction of reliability resulting from stress.

According to the third aspect, the insulator film is partially formed by the first heat treatment performed at a low temperature with a low oxidizing velocity so that thickness controllability can be improved as compared with a case of forming the entire insulator film at a high temperature exceeding the temperature causing viscous flow of the insulator film with a high oxidizing velocity. Further, the second heat treatment is performed at the temperature exceeding that causing viscous flow of the insulator film after performing the first heat treatment at the temperature less than that causing viscous flow of the insulator film, whereby it is possible to avoid slip dislocation easily caused around the wafer when the second heat treatment is performed by increasing the temperature to a level exceeding that causing viscous flow of the insulator film at one fling.

The aforementioned method of fabricating a semiconductor device according to the third aspect preferably further comprises a step of forming an element isolation trench on the main surface of the semiconductor layer in advance of formation of the insulator film. The step of forming the insulator film includes a step of forming the insulator film on a portion of the main surface of the semiconductor layer exposed in the vicinity of an upper corner of the element isolation trench. According to this structure, stress caused in the vicinity of the upper corner of the element isolation trench can be easily relaxed by viscous flow of the insulator film.

In the aforementioned method of fabricating a semiconductor device according to the third aspect, the step of forming the insulator film may include a step of forming a portion having a first thickness less than half the thickness of the insulator film by the first heat treatment and thereafter forming a portion having a second thickness larger than half the thickness of the insulator film by the second heat treatment. According to this structure, the time for the second heat treatment performed at the temperature exceeding that causing viscous flow of the insulator film is so increased that the effect of relaxing stress by viscous flow can be increased.

In the aforementioned method of fabricating a semiconductor device according to the third aspect, the step of forming the insulator film may include a step of forming a portion having a third thickness larger than half the thickness of the insulator film by the first heat treatment and thereafter forming a portion having a fourth thickness less than half the thickness of the insulator film by the second heat treatment. According to this structure, the time for the second heat treatment having a high oxidizing velocity can be so reduced that thickness controllability for the insulator film can be further improved.

The aforementioned method of fabricating a semiconductor device according to the third aspect preferably further comprises a step of exposing the surface of the semiconductor layer in advance of the step of forming the insulator film, for forming the insulator film with a thickness of not more than 2.5 nm by carrying out the steps of exposing the surface of the semiconductor layer and forming the insulator film in a vacuum. According to this structure, it is possible to prevent the surface of the semiconductor layer from formation of a native oxide film after exposing the surface of the semiconductor layer and before forming the insulator film, whereby the insulator film can be easily formed with a small thickness of not more than 2.5 nm.

The aforementioned method of fabricating a semiconductor device according to the third aspect preferably further comprises a step of increasing the temperature stepwise from the temperature less than the temperature causing viscous flow of the insulator film employed in the first heat treatment to the temperature exceeding the temperature causing viscous flow of the insulator film for performing the second heat treatment in a non-oxidizing atmosphere after the first heat treatment. According to this structure, it is possible to further effectively avoid slip dislocation easily caused around the wafer when the second heat treatment is performed by increasing the temperature to a level exceeding that causing viscous flow of the insulator film at one fling.

In the aforementioned method of fabricating a semiconductor device according to the third aspect, the content of the oxidizing gas in the second heat treatment is preferably smaller than the content of the oxidizing gas in the first heat treatment. According to this structure, the easily increased oxidizing velocity in the high-temperature second heat treatment can be so retarded that thickness controllability for the insulator film can be further improved.

In the aforementioned method of fabricating a semiconductor device according to the third aspect, the step of performing the first treatment preferably includes a step of oxidizing the main surface of the semiconductor layer by the first heat treatment while heating the main surface of the semiconductor layer under the atmosphere containing the oxidizing gas at a temperature less than the temperature causing viscous flow of the insulator film. According to this structure, the heating step and the step of oxidizing the main surface of the semiconductor layer by the first heat treatment can be simultaneously carried out, whereby the time for the oxidation process can be reduced.

In the aforementioned method of fabricating a semiconductor device according to the third aspect, the step of performing the second heat treatment preferably includes a step of oxidizing the main surface of the semiconductor layer by the second heat treatment while heating the main surface of the semiconductor layer under the atmosphere containing the oxidizing gas at a temperature exceeding the temperature causing viscous flow of the insulator film. According to this structure, the heating step and the step of oxidizing the main surface of the semiconductor layer by the second heat treatment can be simultaneously carried out, whereby the time for the oxidation process can be reduced.

In the aforementioned method of fabricating a semiconductor device according to the third aspect, the step of performing the first heat treatment preferably includes a step of oxidizing the main surface of the semiconductor layer by the first heat treatment while heating the main surface of the semiconductor layer under the atmosphere containing the oxidizing gas at a temperature less than the temperature causing viscous flow of the insulator film, and the step of performing the second heat treatment preferably includes a step of oxidizing the main surface of the semiconductor layer by the second heat treatment while heating the main surface of the semiconductor layer under the atmosphere containing the oxidizing gas at a temperature exceeding the temperature causing viscous flow of the insulator film. According to this structure, the heating step and the steps of oxidizing the main surface of the semiconductor layer by the first heat treatment and the second heat treatment can be simultaneously carried out, whereby the time for the oxidation process can be further reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

(First Embodiment)

A fabrication process for a semiconductor device according to a first embodiment of the present invention is described with reference to FIGS. 1 to 10.

Figure 1:
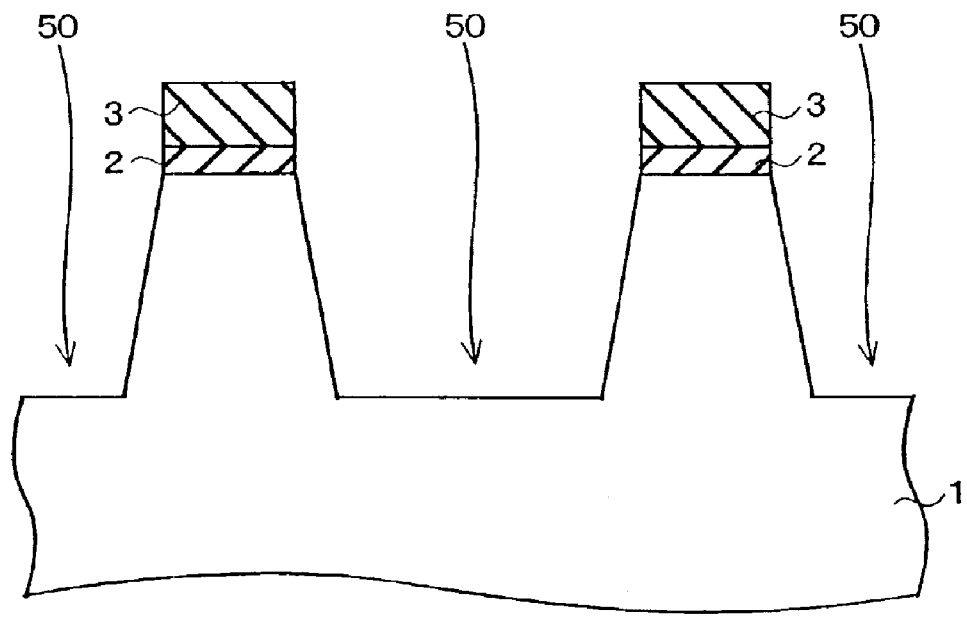
FIGS. 1 to 9 are sectional views for illustrating a fabrication process for a semiconductor device including a MOS transistor according to a first embodiment of the present invention.

First, silicon oxide films 2 of about 10 nm in thickness are formed on a silicon substrate 1 by thermal oxidation, and silicon nitride films 2 of about 150 nm in thickness are thereafter formed by CVD, as shown in FIG. 1. The silicon oxide films 2 and the silicon nitride films 3 are patterned and employed as masks for dry-etching portions of the silicon substrate 1 for defining element isolation regions by a thickness of about 300 nm, thereby forming element isolation trenches 50. The silicon substrate 1 is an example of the "semiconductor layer" in the present invention.

Figure 2:
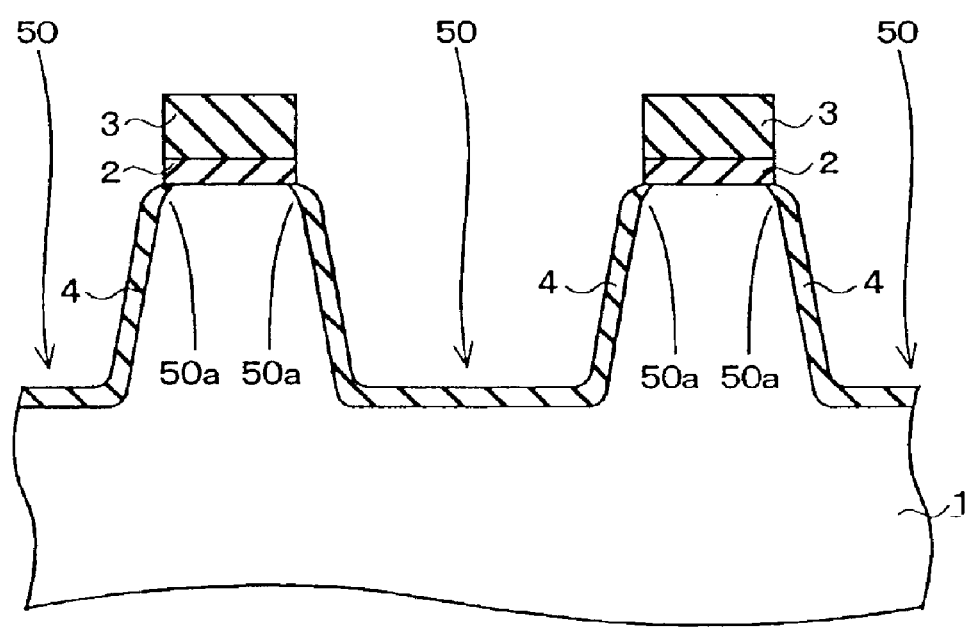

Then, heat treatment is performed at a temperature of about 1000° C. to about 1200° C. thereby forming liner oxide films 4 of silicon oxide having a thickness of about 20 nm on the surfaces of the element isolation trenches 50, as shown in FIG. 2. In this case, strong stress is caused in the vicinity of upper corners 50a of the element isolation trenches 50 due to cubical expansion resulting from oxidation and the presence of the silicon nitride films 3 functioning as oxidation-resistant masks.

Figure 3:
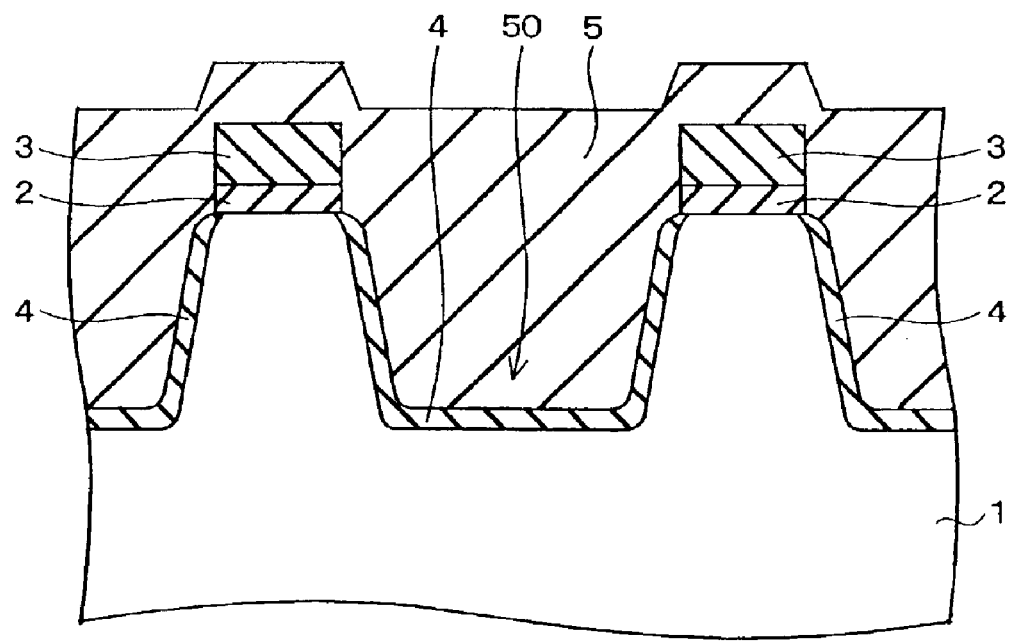
Figure 4:
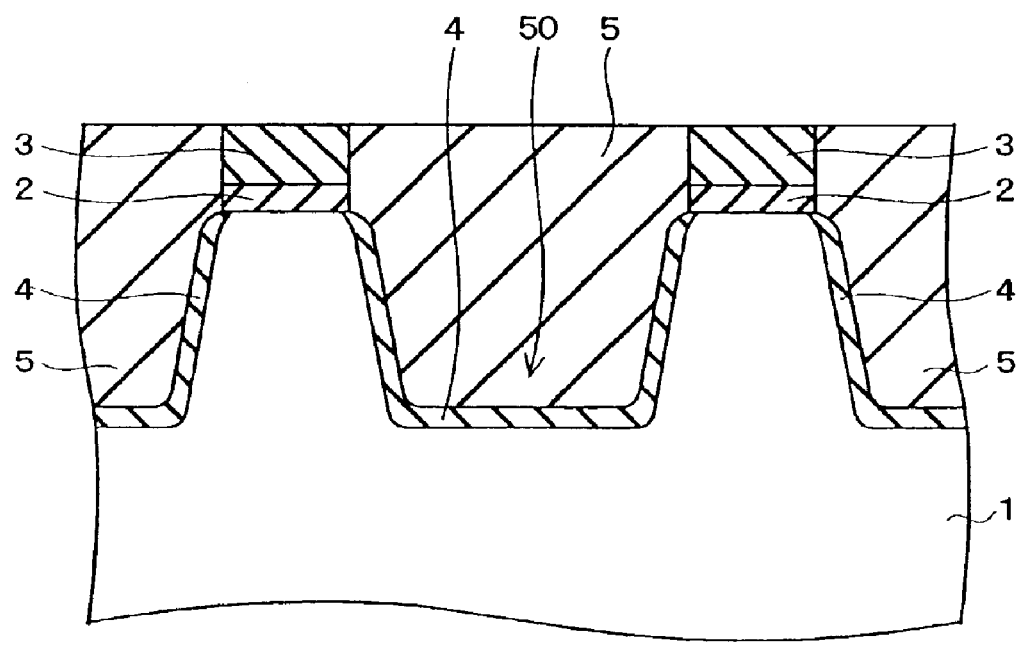

As shown in FIG. 3, silicon oxide films 5 of about 600 nm in thickness are deposited by high-density plasma CVD to fill up the element isolation trenches 50. Thereafter the silicon nitride films 3 are employed as stoppers for polishing and partially removing the silicon oxide films 5 by CMP, thereby flattening the silicon oxide films 5 as shown in FIG. 4.

Figure 5:
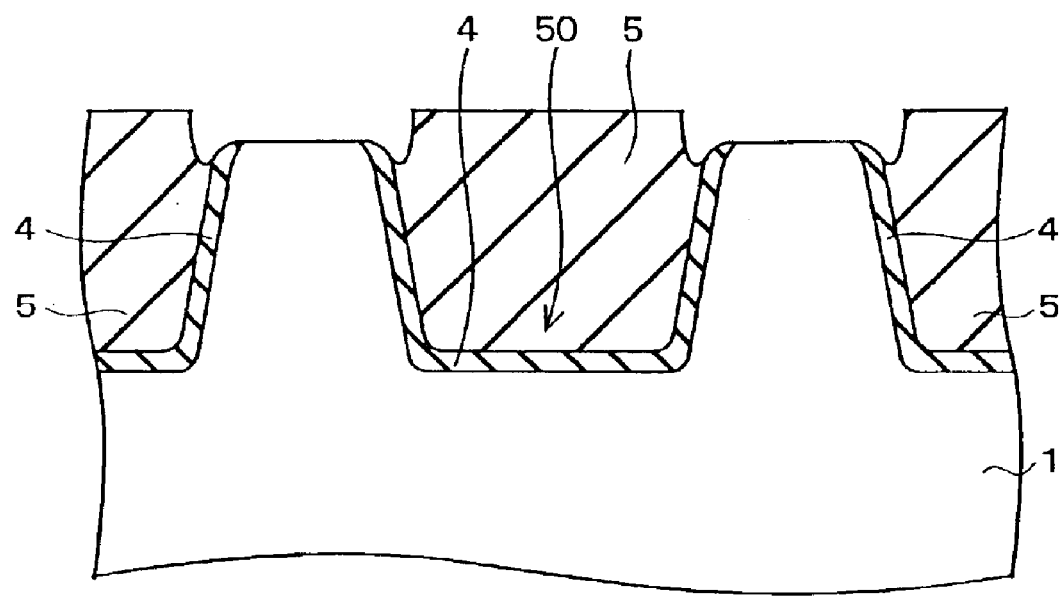

Then, the silicon nitride films 3 are removed by wet etching with phosphoric acid and the silicon oxide films 2 are thereafter removed by wet etching with dilute hydrofluoric acid, thereby exposing active regions (element forming regions) of the silicon substrate 1 as shown in FIG. 5. When the silicon oxide films 2 are removed by wet etching, the upper and side surfaces of the silicon oxide films 5 are also etched to some extent. Thus, element isolation films consisting of silicon oxide are embedded in the element isolation trenches 50 for forming the element isolation regions.

Figure 6:
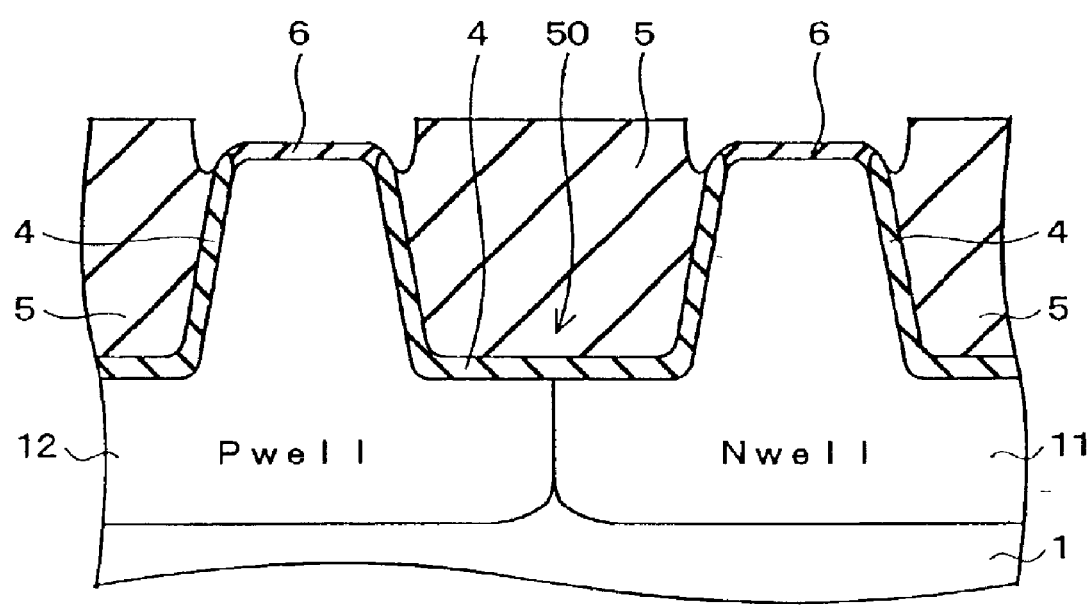
Figure 7:
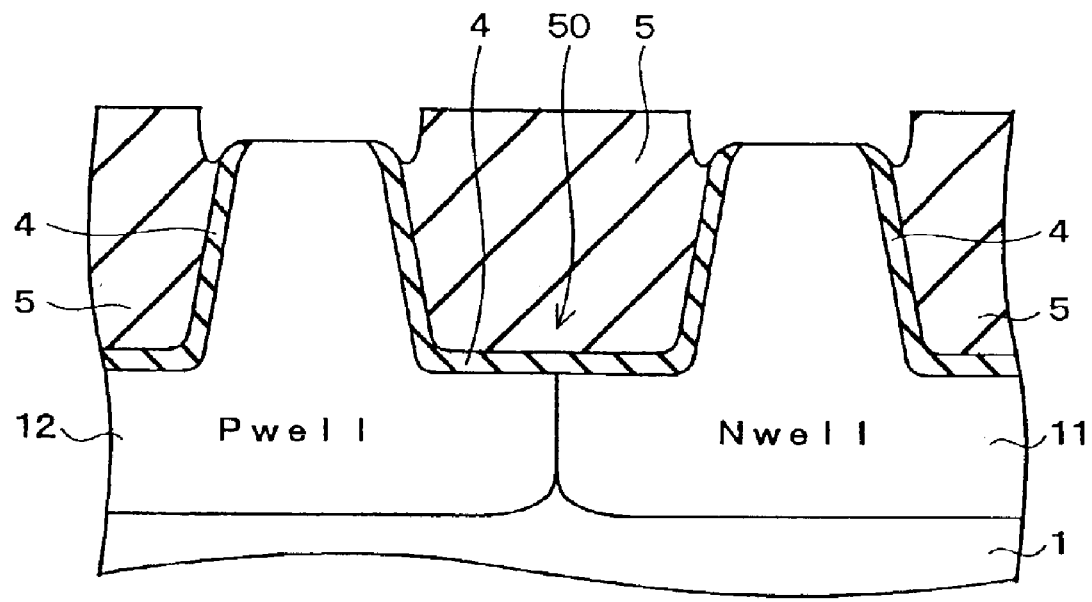

As shown in FIG. 6, the surfaces of the exposed element forming regions are heat-treated by thermal oxidation in a wet oxidizing atmosphere of about 800° C. containing about 10 vol. % of $O_2$ gas thereby forming sacrifice oxide films 6 of silicon oxide. An n-type impurity and a p-type impurity are ion-implanted from above the silicon substrate 1 through the sacrifice oxide films 6 respectively, thereby forming an n-type well region 11 and a p-type well region 12. Thereafter the sacrifice oxide films 6 are removed with dilute hydrofluoric acid, thereby exposing the element forming regions of the silicon substrate 1 as shown in FIG. 7.

Figure 8:
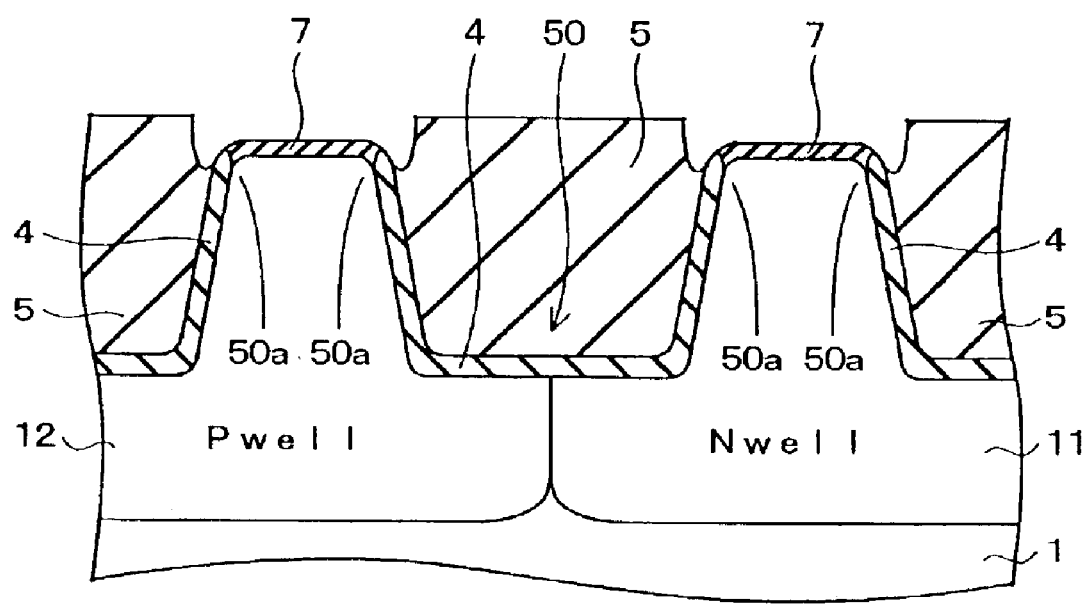
Figure 10:
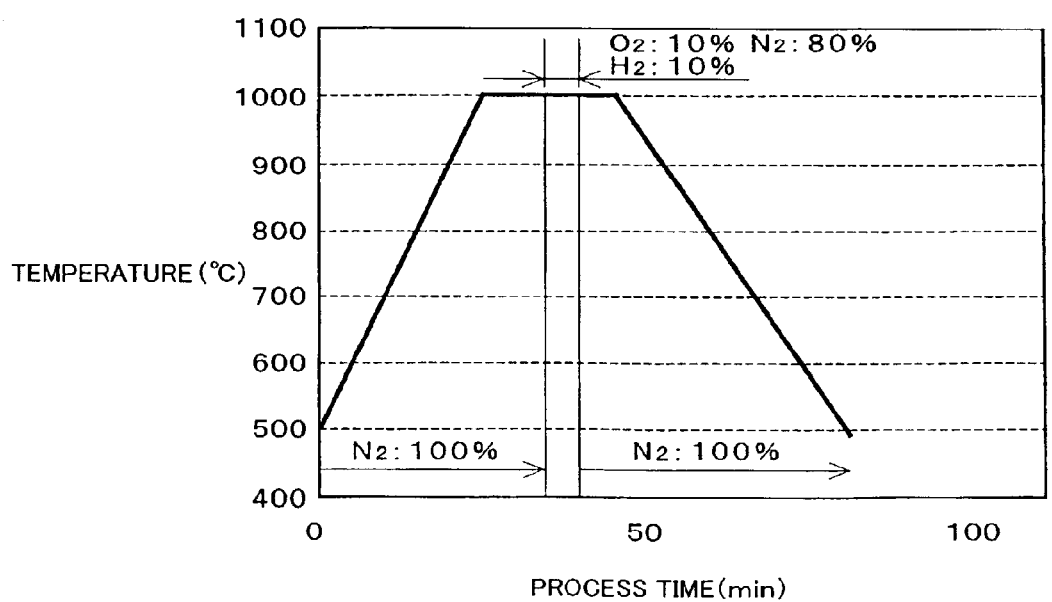
FIG. 10 is a sequence diagram showing conditions for forming a gate insulator film of the MOS transistor according to the first embodiment.

According to the first embodiment, gate insulator films 7 of silicon oxide are formed on the surfaces of the exposed element forming regions of the silicon substrate 1 by thermal oxidation under a high-temperature condition of about 1000° C., as shown in FIG. 8. More specifically, temperature increase and temperature reduction steps are carried out in an $N_2$ gas atmosphere which is a nonoxidizing atmosphere while heat treatment is performed in a wet oxidizing atmosphere containing about 10 vol. % of $O_2$ gas, about 10 vol. % of $H_2$ gas and about 80 vol. % of $N_2$ gas at a high temperature of about 1000° C. as shown in FIG. 10, thereby forming the gate insulator films 7 of silicon oxide having a thickness of about 7 nm. When formed at the high temperature of about 1000° C., the gate insulator films 7 become viscoelastic and can viscously flow. The gate insulator films 7 are examples of the "gate insulator film" in the present invention.

Figure 9:
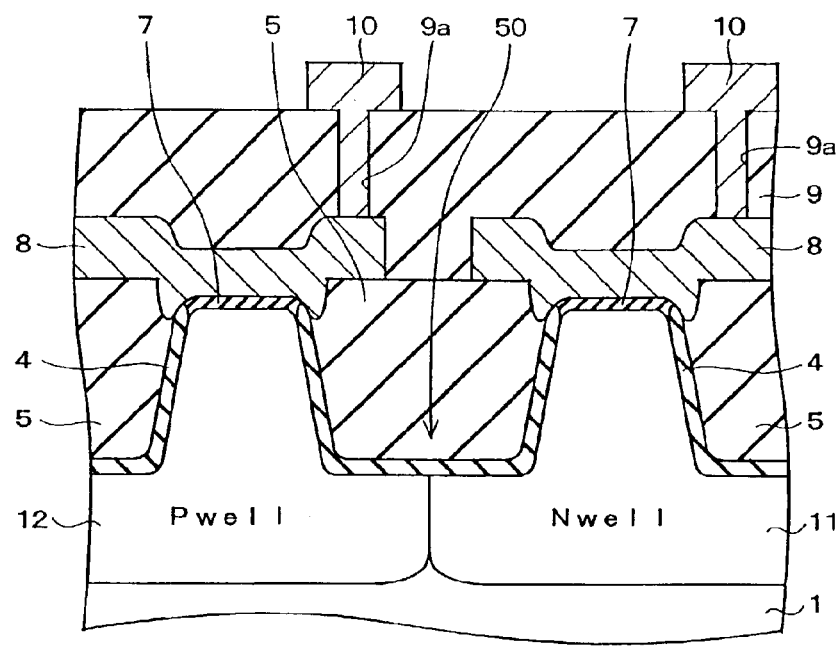

Finally, gate electrodes 8 of polysilicon are formed on the silicon oxide films 5 to come into contact with the upper surfaces of the gate insulator films 7, as shown in FIG. 9. The gate electrodes 8 are employed as masks for ion-implanting impurities, thereby forming a source region (not shown) and a drain region (not shown) in the n-type well region 11 and the p-type well region 12 respectively. An interlayer dielectric film 9 consisting of silicon oxide or silicon nitride is formed to cover the overall surface, and contact holes 9a are thereafter formed in prescribed regions of the interlayer dielectric film 9. Electrodes 10 of an aluminum alloy are formed to be electrically in contact with the source region, the drain region and the gate electrodes 8 respectively through the contact holes 9a. Thus, the semiconductor device including a MOS transistor is completed according to the first embodiment.

According to the first embodiment, as hereinabove described, heat treatment is performed in an atmosphere containing oxidizing gas ($O_2$ gas) at a temperature (about 1000° C.) exceeding that causing viscous flow of the gate insulator films 7 thereby forming the gate insulator films 7, so that the gate insulator films 7 become viscoelastic and can viscously flow (move) to release strong stress caused in regions close to the upper corners 50a of the element isolation trenches 50 in formation of the liner oxide films 4. Thus, the strong stress on the upper corners 50a of the element isolation trenches 50 caused in formation of the liner oxide films 4 can be so relaxed that the gate insulator films 7 formed to cover the upper corners 50 can be improved in reliability. In particular, time dependent dielectric breakdown (TDDB) employed as the measure for evaluating reliability of the gate insulator films 7 can be inhibited from reduction.

(Second Embodiment)

Figure 11:
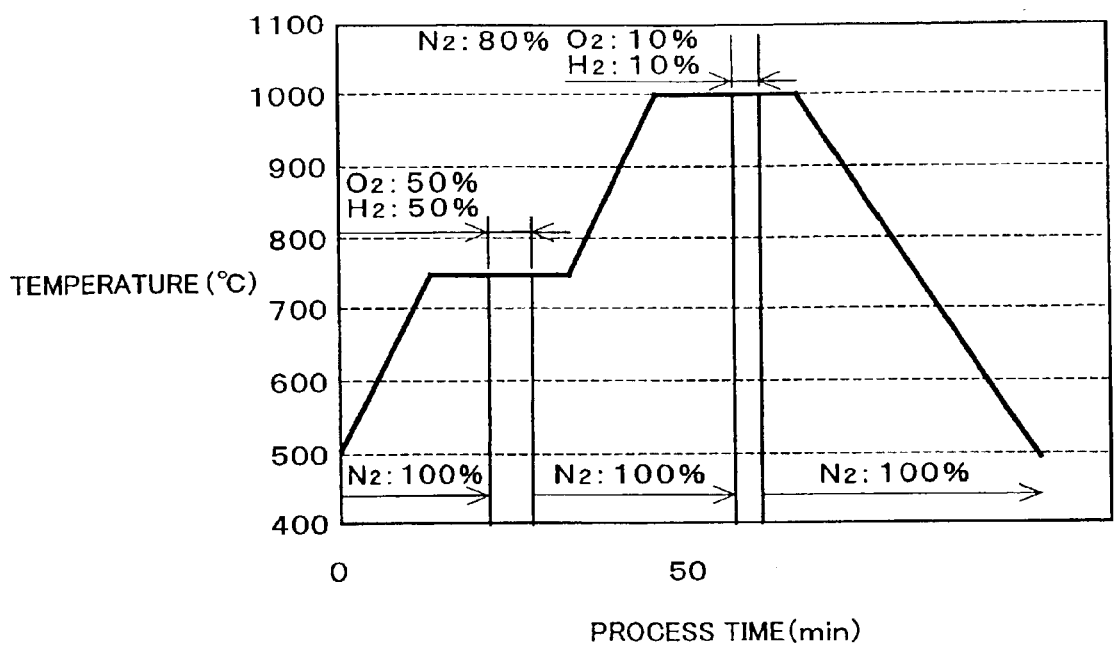
FIG. 11 is a sequence diagram showing conditions for forming a gate insulator film of a MOS transistor according to a second embodiment of the present invention.

Referring to FIG. 11, a method of fabricating a semiconductor device according to a second embodiment of the present invention is described with reference to a case of performing first heat treatment in an atmosphere containing oxidizing gas at a temperature less than that causing viscous flow of gate insulator films and thereafter performing second heat treatment in an atmosphere containing oxidizing gas at a temperature exceeding that causing viscous flow of the gate insulator films dissimilarly to the aforementioned first embodiment. The remaining fabrication process according to the second embodiment is similar to that according to the first embodiment.

According to the second embodiment, a structure identical to that shown in FIG. 7 is formed through a process similar to that of the first embodiment shown in FIGS. 1 to 7. According to the second embodiment, a step of forming gate insulator films similar to those of the first embodiment shown in FIG. 8 is thereafter carried out under conditions shown in FIG. 11. More specifically, the temperature is increased to a level (about 750° C.) less than the temperature causing viscous flow of the gate insulator films in an $N_2$ gas atmosphere which is a non-oxidizing atmosphere, as shown in FIG. 11. Then, the first heat treatment is performed at a relatively low temperature under a temperature condition of about 750° C. in a wet oxidizing atmosphere containing about 50 vol. % of $O_2$ gas and about 50 vol. % of $H_2$ gas thereby partially forming the gate insulator films consisting of silicon oxide with a thickness of about 4 nm. Then, the temperature is increased to a level (about 1000° C.) exceeding the temperature causing viscous flow of the gate insulator films in an $N_2$ gas atmosphere, which is a non-oxidizing atmosphere. Then, the second heat treatment is performed at a high temperature under a temperature condition of about 1000° C. in a wet oxidizing atmosphere containing about 10 Vol. % of $O_2$ gas, about 10 vol. % of $H_2$ gas and about 80 vol. % of $N_2$ gas thereby forming the remaining parts of the gate insulator films of silicon oxide with a thickness of about 3 nm. Thus, the gate insulator films of silicon oxide having a thickness of about 7 nm in total are formed on element forming regions according to the second embodiment. The gate insulator films according to the second embodiment are examples of the "gate insulator film" and the "insulator film" in the present invention.

Thereafter a semiconductor device including a MOS transistor is completed according to the second embodiment through a process similar to that of the first embodiment shown in FIG. 9.

When the gate insulator films are formed at a temperature exceeding about 1000° C., impurities contained in well regions may outwardly diffuse from exposed surface portions of a silicon substrate to result in heterogeneous impurity concentration in the well regions (channel regions). According to the second embodiment, the first heat treatment is performed at the temperature (about 750° C.) less than that causing viscous flow of the gate insulator films and the second heat treatment is thereafter performed at the temperature (about 1000° C.) exceeding that causing viscous flow of the gate insulator films as hereinabove described, whereby the gate insulator films are partially formed by the first heat treatment performed at the low temperature of about 750° C. in advance of the second heat treatment performed at the high temperature of about 1000° C. In the second heat treatment performed at a high temperature, therefore, the impurities contained in the well regions (channel regions) can be inhibited from outwardly diffusing from the exposed surface portions of the silicon substrate. Thus, it is possible to suppress such an inconvenience that a threshold voltage varies with the device due to heterogeneous impurity concentration resulting from out diffusion of the impurities in the well regions (channel regions).

According to the second embodiment, further, the first heat treatment is performed at the temperature (about 750° C.) less than that causing viscous flow of the gate insulator films and the second heat treatment is thereafter performed at the temperature (about 1000° C.) exceeding that causing viscous flow of the gate insulator films as hereinabove described, whereby the gate insulator films are partially formed by the first heat treatment performed at a low temperature in advance of the second heat treatment performed at a high temperature so that exposed surfaces of upper corners of element isolation trenches can be inhibited from being irregularized in the second heat treatment performed at a high temperature. It is known that the surface of the silicon substrate is irregularized if the same is heated to a high temperature in an atmosphere with lean oxygen in an exposed state or a state formed with a native oxide film of not more than 1 nm in thickness. According to the second embodiment, the gate insulator films are previously partially formed by the first heat treatment performed at a low temperature, whereby the surfaces of the upper corners of the element isolation trenches can be inhibited from being irregularized. Consequently, it is possible to suppress such an inconvenience that reliability of the gate insulator films formed on the surfaces of the upper corners is deteriorated due to irregular shapes thereof.

According to the second embodiment, the gate insulator films are partially formed by the first heat treatment performed at a low temperature (about 750° C.) with a low oxidizing velocity as hereinabove described so that controllability for the thicknesses of the gate insulator films can be further improved as compared with the first embodiment forming the overall gate insulator films 7 at one fling by the heat treatment performed at a high temperature (about 1000° C.) with a high oxidizing velocity.

According to the second embodiment, further, the first heat treatment is performed at the temperature (about 750° C.) less than that causing viscous flow of the gate insulator films and the second heat treatment is thereafter performed at the temperature (about 1000° C.) exceeding that causing viscous flow of the gate insulator films as hereinabove described, whereby it is possible to avoid slip dislocation easily caused around the wafer when heat treatment is performed by increasing the temperature to a level (about 1000° C.) exceeding that causing viscous flow of the gate insulator films at one fling.

According to the second embodiment, as hereinabove described, the second heat treatment is performed in the atmosphere containing oxidizing gas ($O_2$ gas) at the temperature (about 1000° C.) exceeding that causing viscous flow of the gate insulator films so that the gate insulator films become viscoelastic similarly to those in the first embodiment. Therefore, the gate insulator films can viscously flow (move) to release strong stress caused in regions close to the upper corners of the element isolation trenches in formation of liner oxide films. Thus, the strong stress on the upper corners of the element isolation trenches caused in formation of the liner oxide films can be so relaxed that the gate insulator films formed to cover the upper corners can be improved in reliability such as TDDB.

According to the second embodiment, as hereinabove described, silicon oxide films having a thickness of about 4 nm larger than half the total thickness (about 7 nm) of the gate insulator films are formed by the first heat treatment and silicon oxide films having a thickness of about 3 nm smaller than half the thickness of the overall gate insulator films are thereafter formed by the second heat treatment, whereby the time for the second heat treatment performed at the high temperature of about 1000° C. with a high oxidizing velocity can be so reduced that thickness controllability for the gate insulator films can be further improved. Further, the impurities can be further inhibited from out diffusion due to the reduced time for the second heat treatment performed at a high temperature.

According to the second embodiment, as hereinabove described, the content (10 vol. %) of oxidizing gas ($O_2$ gas) in the second heat treatment is reduced below the content (50 vol. %) of the oxidizing gas ($O_2$ gas) in the first heat treatment, whereby the easily increased oxidizing velocity of the high-temperature second heat treatment can be so retarded that thickness controllability for the gate insulator films can be further improved.

(Third Embodiment)

Figure 12:
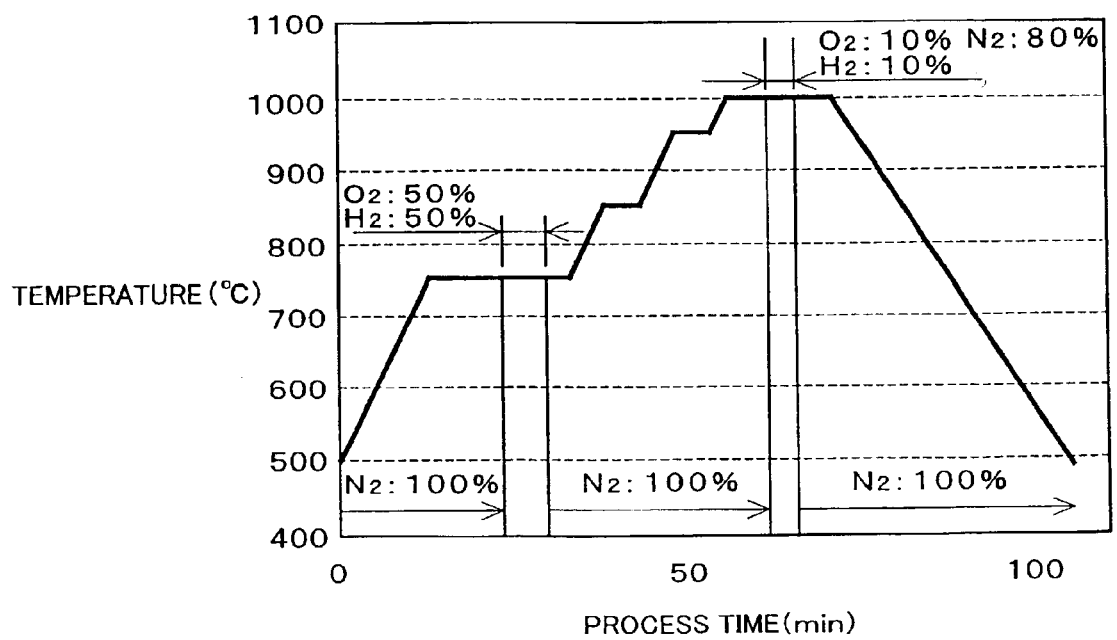
FIG. 12 is a sequence diagram showing conditions for forming a gate insulator film of a MOS transistor according to a third embodiment of the present invention.

Referring to FIG. 12, a method of fabricating a semiconductor device according to a third embodiment of the present invention is described with reference to a case of performing first heat treatment in an atmosphere containing oxidizing gas at a temperature less than that causing viscous flow of gate insulator films, then increasing the temperature stepwise and thereafter performing second heat treatment in an atmosphere containing oxidizing gas at a temperature exceeding that causing viscous flow of the gate insulator films. The remaining fabrication process according to the third embodiment is similar to that according to the first embodiment.

According to the third embodiment, a structure identical to that shown in FIG. 7 is formed through a process similar to that of the first embodiment shown in FIGS. 1 to 7. According to the third embodiment, a step of forming gate insulator films similar to those of the first embodiment shown in FIG. 8 is thereafter carried out under conditions shown in FIG. 12. More specifically, the temperature is increased to a level (about 750° C.) less than the temperature causing viscous flow of the gate insulator films in an $N_2$ gas atmosphere, as shown in FIG. 12.

Then, the first heat treatment is performed at a relatively low temperature under a temperature condition of about 750° C. in a wet oxidizing atmosphere containing about 50 vol. % of $O_2$ gas and about 50 vol. % of $H_2$ gas thereby partially forming the gate insulator films of silicon oxide by a thickness of about 4 nm. Thereafter the temperature is increased stepwise to a level (about 1000° C.) exceeding the temperature causing viscous flow of the gate insulator films in an $N_2$ gas atmosphere, which is a non-oxidizing atmosphere, in three stages. Then, the second heat treatment is performed at a high temperature under a temperature condition of about 1000° C. in a wet oxidizing atmosphere containing about 10 vol. % of $O_2$ gas, about 10 vol. % of $H_2$ gas and about 80 vol. % of $N_2$ gas thereby forming the remaining parts of the gate insulator films of silicon oxide with a thickness of about 3 nm. Thus, the gate insulator films of silicon oxide having a thickness of about 7 nm in total are formed on element forming regions according to the third embodiment. The gate insulator films according to the third embodiment are examples of the "gate insulator film" and the "insulator film" in the present invention.

Thereafter a semiconductor device including a MOS transistor is completed according to the third embodiment through a process similar to that of the first embodiment shown in FIG. 9.

According to the third embodiment, as hereinabove described, the temperature is increased stepwise in the non-oxidizing N₂ gas atmosphere from the level (about 750° C.) less than that causing viscous flow of the gate insulator films employed in the first heat treatment to the level (about 1000° C.) exceeding that causing viscous flow of the gate insulator films employed in the second heat treatment, whereby it is possible to further effectively avoid slip dislocation easily caused around the wafer when heat treatment is performed by increasing the temperature to a level (about 1000° C.) exceeding that causing viscous flow of the gate insulator films at one fling.

The remaining effect of the third embodiment is similar to that of the aforementioned second embodiment.

(Fourth Embodiment)

Figure 13:
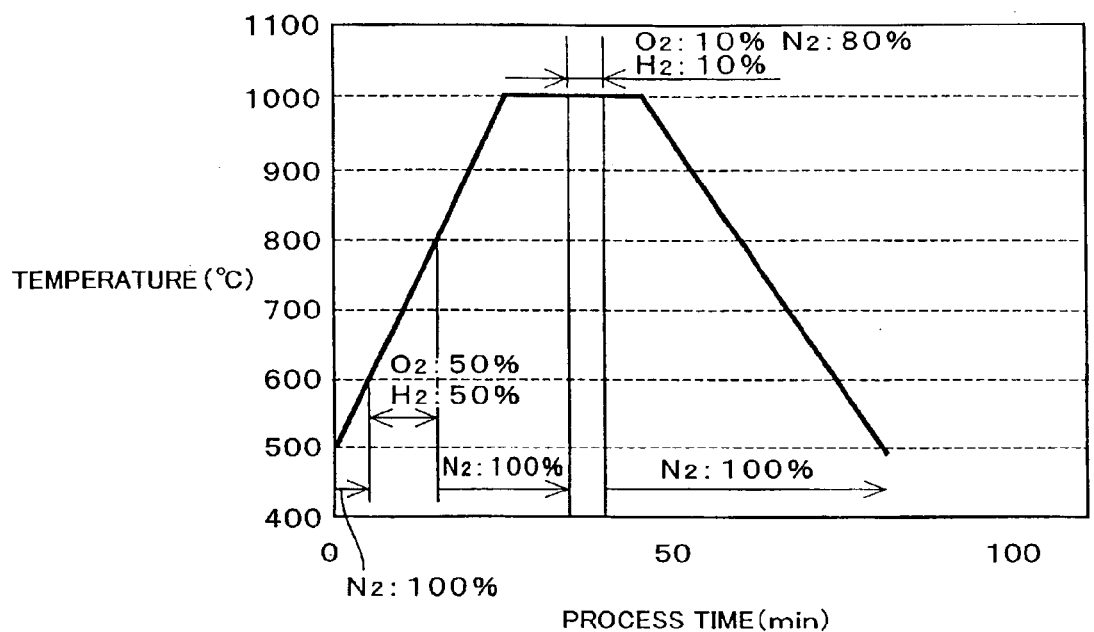
FIG. 13 is a sequence diagram showing conditions for forming a gate insulator film of a MOS transistor according to a fourth embodiment of the present invention.

Referring to FIG. 13, a method of fabricating a semiconductor device according to a fourth embodiment of the present invention is described with reference to a case of performing first heat treatment in an atmosphere containing oxidizing gas at a temperature less than that causing viscous flow of gate insulator films and thereafter performing second heat treatment in an atmosphere containing oxidizing gas at a temperature exceeding that causing viscous flow of the gate insulator films. The remaining fabrication process according to the second embodiment is similar to that according to the first embodiment.

According to the fourth embodiment, a structure identical to that shown in FIG. 7 is formed through a process similar to that of the first embodiment shown in FIGS. 1 to 7. According to the fourth embodiment, a step of forming gate insulator films similar to those of the first embodiment shown in FIG. 8 is thereafter carried out under conditions shown in FIG. 13. More specifically, the temperature is increased to a level (about 600° C.) less than the temperature causing viscous flow of the gate insulator films in an N₂ gas atmosphere, as shown in FIG. 13.

According to the fourth embodiment, the first heat treatment is thereafter performed at a relatively low temperature in a wet oxidizing atmosphere containing about 50 vol. % of O₂ gas and about 50 vol. % of H₂ gas while increasing the temperature from about 600° C. to about 800° C., thereby partially forming the gate insulator films of silicon oxide with a thickness of about 4 nm. Then, the temperature is increased to a level (about 1000° C.) exceeding the temperature causing viscous flow of the gate insulator films in an N₂ gas atmosphere, which is a non-oxidizing atmosphere. Then, the second heat treatment is performed at a high temperature under a temperature condition of about 1000° C. in a wet oxidizing atmosphere containing about 10 vol. % of O₂ gas, about 10 vol. % of H₂ gas and about 80 vol. % of N₂ gas thereby forming the remaining parts of the gate insulator films of silicon oxide with a thickness of about 3 nm. Thus, the gate insulator films of silicon oxide having a thickness of about 7 nm in total are formed on element forming regions according to the fourth embodiment. The gate insulator films according to the fourth embodiment are examples of the "gate insulator film" and the "insulator film" in the present invention.

Thereafter a semiconductor device including a MOS transistor is completed according to the fourth embodiment through a process similar to that of the first embodiment shown in FIG. 9.

According to the fourth embodiment, as hereinabove described, the first heat treatment is performed at the temperature less than that causing viscous flow of the gate insulator films while increasing the temperature from about 600° C. to about 800° C. for oxidation, whereby a temperature increase step and an oxidation step according to the first heat treatment can be so simultaneously carried out that the time for the oxidation process can be reduced as compared with the aforementioned second and third embodiments.

The remaining effect of the fourth embodiment is similar to that of the aforementioned second embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while each of the above embodiments has been described with reference to the case of forming a semiconductor device including a MOS transistor having a gate insulator film, the present invention is not restricted to this but is also applicable to a case of forming a semiconductor device including another semiconductor element having a gate insulator film.

While each of the above embodiments has been described with reference to the case of forming a MOS transistor on an element forming region enclosed with an element isolation region formed by STI, the present invention is not restricted to this but a semiconductor element may alternatively be formed on an element forming region enclosed with an element isolation region formed by another method. Further, the present invention is also applicable to a semiconductor device not subjected to element isolation.

While each of the first to fourth embodiments has been described with reference to the case of exposing an element forming region by wet etching and thereafter forming a gate insulator film having a thickness of about 7 nm on the element forming region, the present invention is not restricted to this but is also applicable to a case of forming a gate insulator film having a small thickness of not more than about 2.5 nm. When forming a gate insulator film having a small thickness of not more than about 2.5 nm, however, steps of exposing an element forming region and forming the gate insulator film are preferably continuously carried out in a vacuum. The steps of exposing the element forming region and forming the gate insulator film are so continuously carried out in a vacuum that the surface of a silicon substrate can be prevented from formation of a native oxide film after exposure of the element forming region and before formation of the gate insulator film, whereby the gate insulator film having a small thickness of not more than about 2.5 nm can be easily formed. For example, a gate insulator film having a small thickness of about 2.0 nm in total may be formed by carrying out the step of exposing the element forming region in a vacuum, then continuously forming a silicon oxide film having a thickness of about 1.2 nm by first heat treatment performed at a temperature of about 750° C. and thereafter forming another silicon oxide film having a thickness of about 0.8 nm by second heat treatment performed at a temperature of about 1000° C.

While oxidizing gas containing H₂ gas, O₂ gas and N₂ gas is employed as the oxidizing gas in each of the aforementioned embodiments, the present invention is not restricted to this but another oxidizing gas may alternatively be employed. For example, gas containing at least one of oxygen (O₂), nitrogen monoxide (NO), dinitrogen oxide (N₂O), hydrogen peroxide (H₂O₂), ozone (O₃), sulfur dioxide (SO₂), chlorine (Cl₂), fluorine (O₂) and compounds thereof may be employed. According to the present invention, the term "oxidation" denotes not only oxidation with oxygen but also a wider concept of oxygen depriving elements or ions of electrons.

While the heat treatment in the aforementioned first embodiment or the second heat treatment in each of the second to fourth embodiments is performed at the temperature of about 1000° C. for forming or partially forming the gate insulator films, the present invention is not restricted to this but the heat treatment or the second heat treatment may alternatively be performed at another heat treatment temperature so far as this temperature exceeds that causing viscous flow of the gate insulator films.

While the first heat treatment in each of the aforementioned second, third and fourth embodiments is performed at the temperature of about 750° C. or about 600° C. to about 800° C. for partially forming the gate insulator films, the present invention is not restricted to this but the first heat treatment may alternatively be performed at another heat treatment temperature allowing formation of oxide films with no viscous flow of the gate insulator films.

While the portions of the gate insulator films having the thickness of about 4 nm, which is larger than half the total thickness (about 7 nm) thereof, are formed by the first heat treatment performed at the temperature of about 750° C. or about 600° C. to about 800° C. and the portions having the thickness of about 3 nm, which is less than half the total thickness thereof, are thereafter formed by the second heat treatment performed at the temperature of about 1000° C. in each of the aforementioned second, third and fourth embodiments, the present invention is not restricted to this but portions of the gate insulator films having a thickness less than half the total thickness thereof may alternatively be formed by the first heat treatment performed at a low temperature for thereafter forming portions having a thickness exceeding half the total thickness thereof by the second heat treatment performed at a high temperature. For example, gate insulator films having a thickness of about 7 nm in total may be formed by forming portions having a thickness of about 3 nm by the first heat treatment performed at a low temperature and thereafter forming portions having a thickness of about 4 nm by the second heat treatment performed at a high temperature. In this case, the time for the second heat treatment performed at a temperature exceeding that causing viscous flow of the gate insulator films is so increased that an effect of relaxing stress by viscous flow can be increased.

Figure 14:
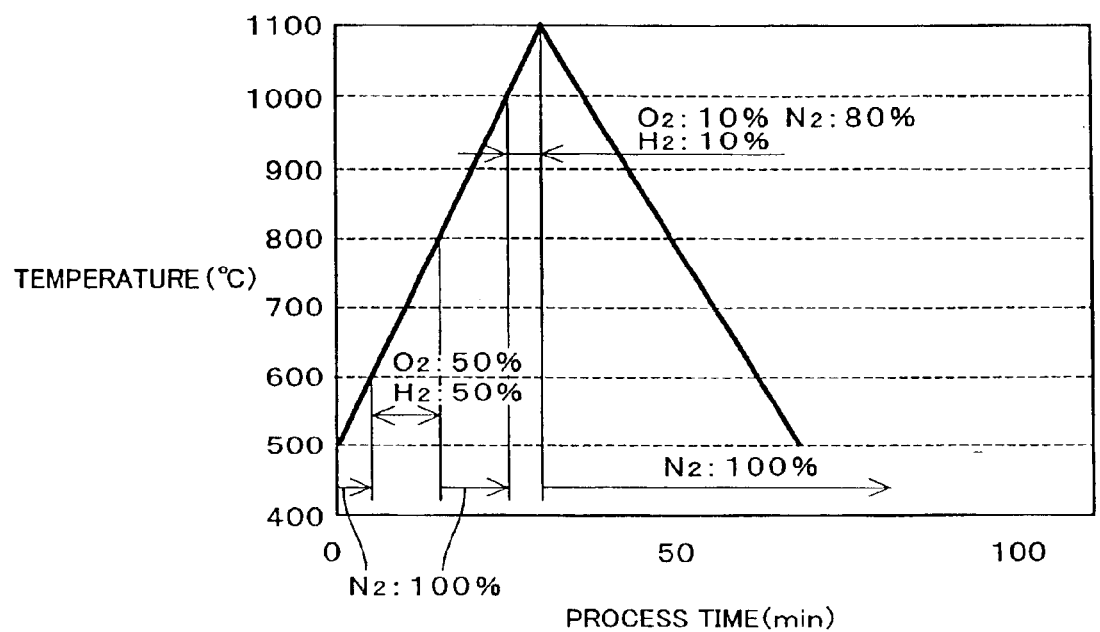
FIG. 14 is a sequence diagram showing conditions for forming a gate insulator film of a MOS transistor according to a modification of the fourth embodiment.
Figure 15:
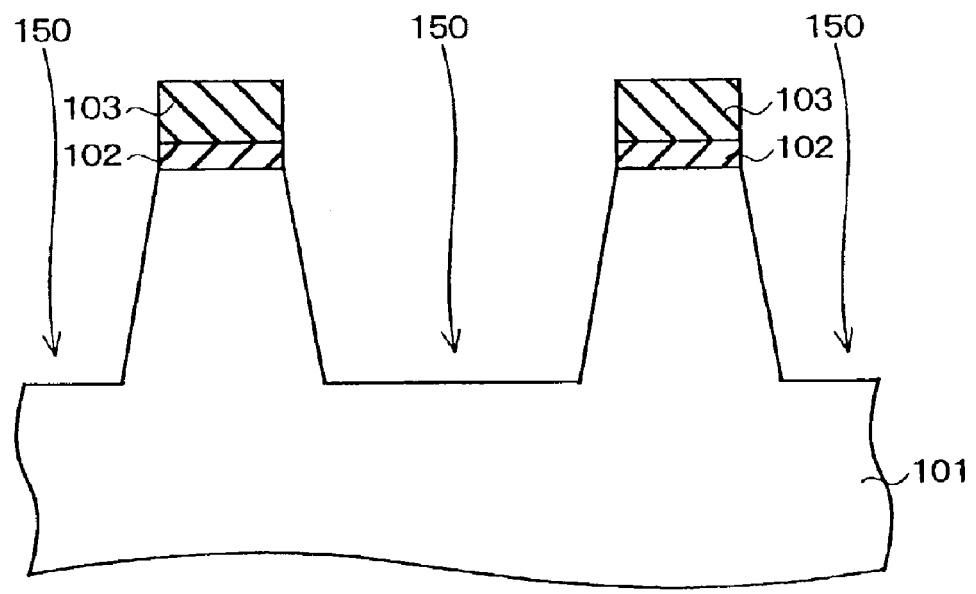
FIGS. 15 to 23 are sectional views for illustrating a conventional fabrication process for a semiconductor device including a MOS transistor.
Figure 16:
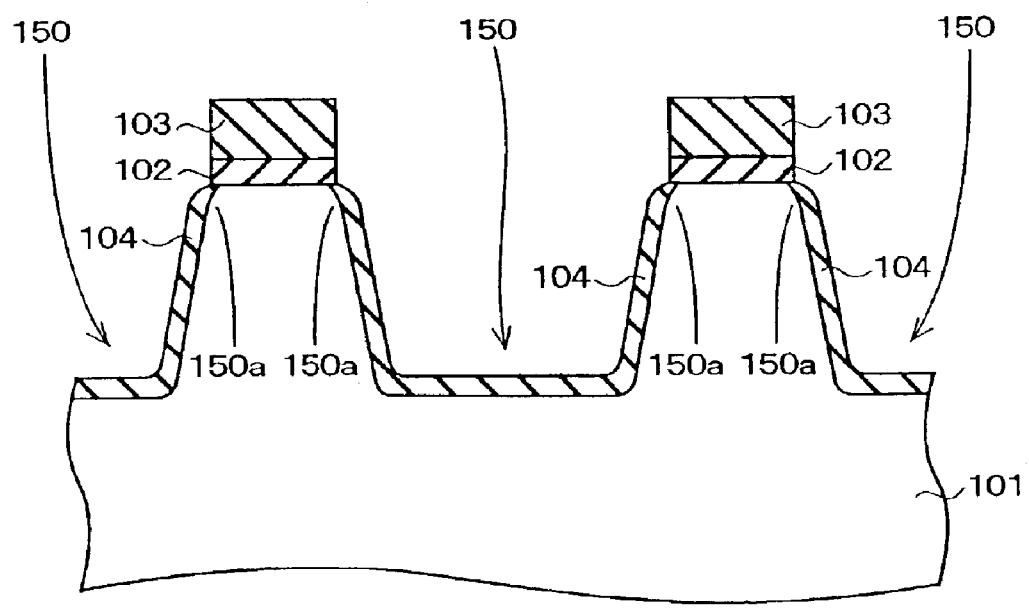
Figure 17:
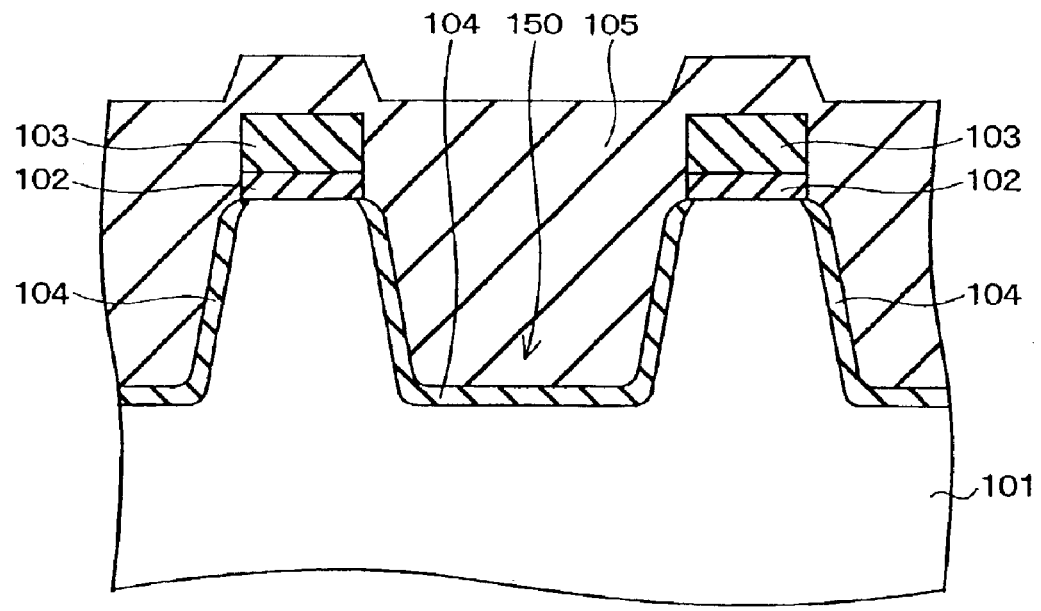
Figure 18:
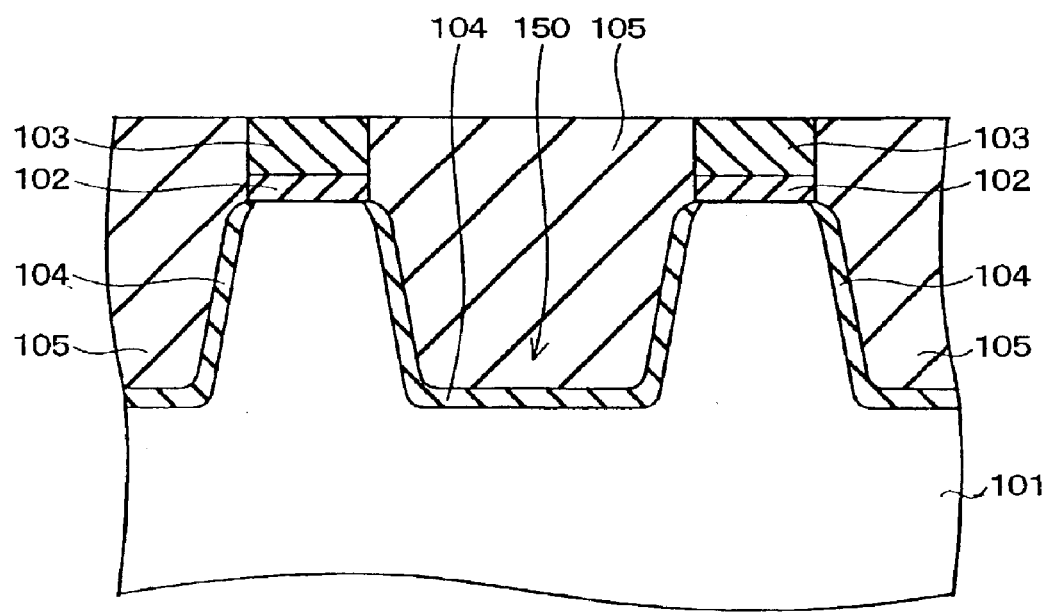
Figure 19:
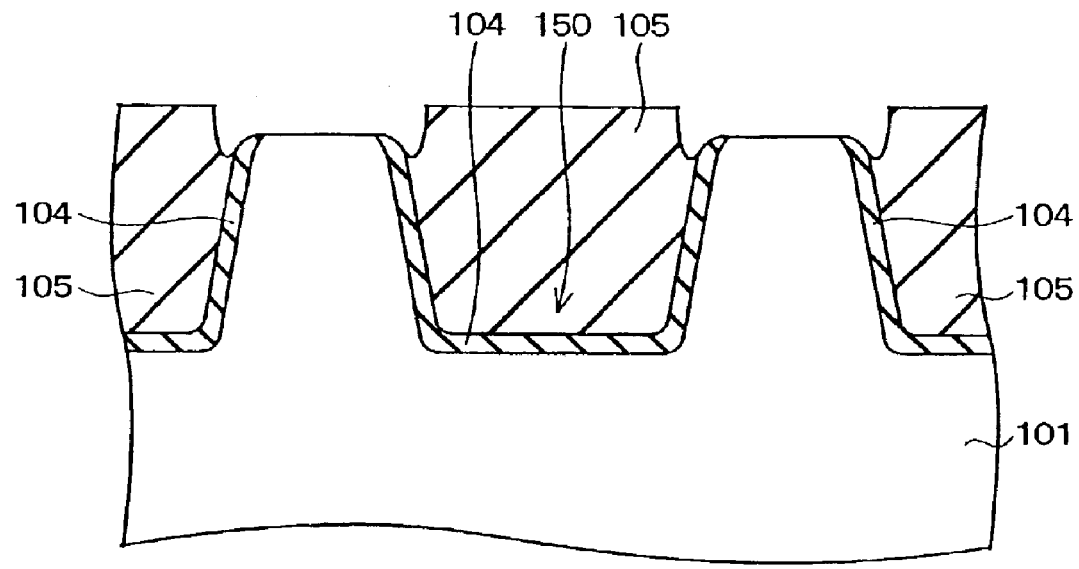
Figure 20:
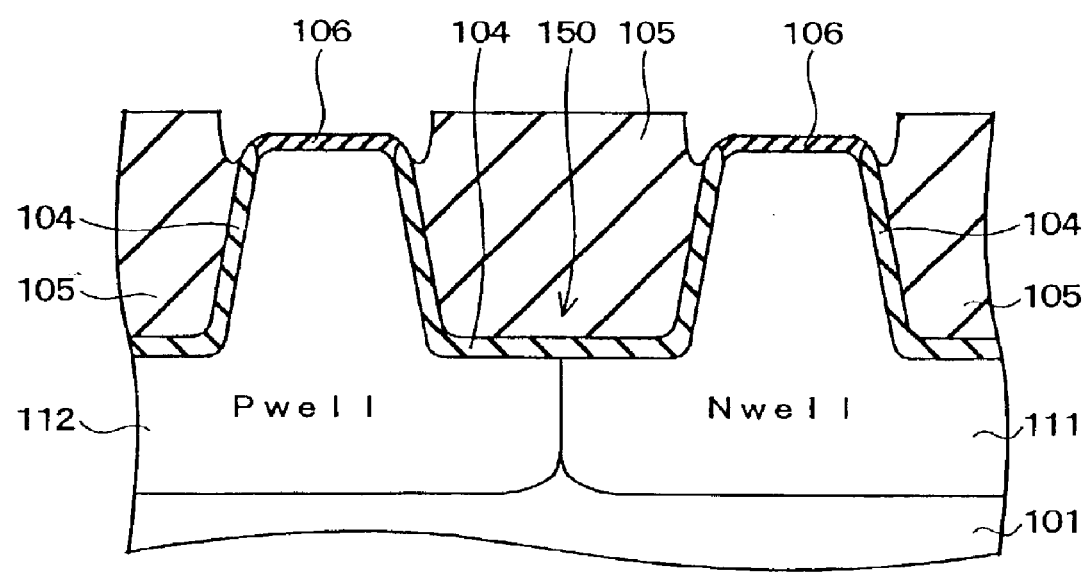
Figure 21:
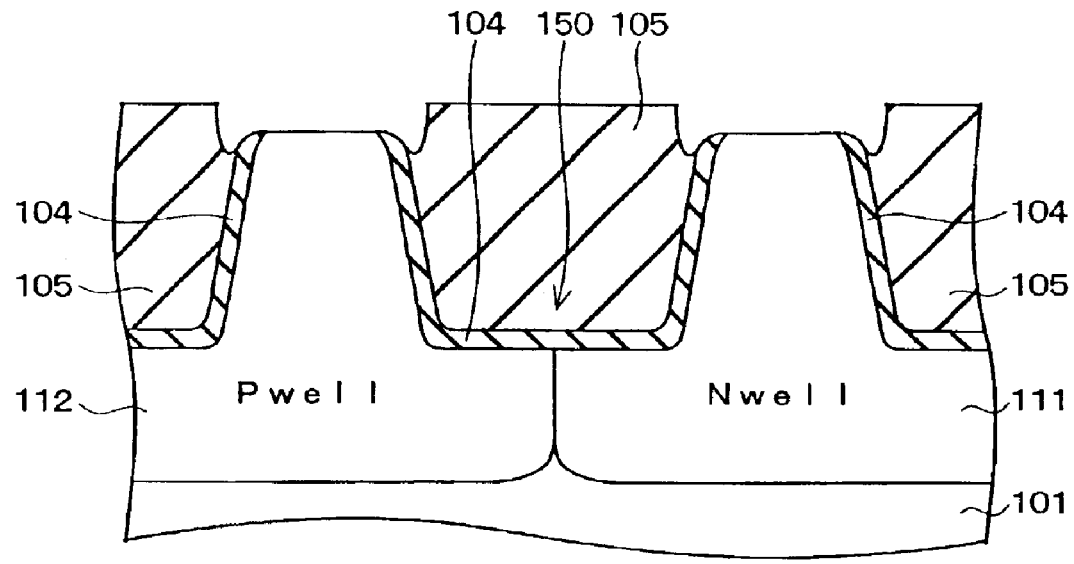
Figure 22:
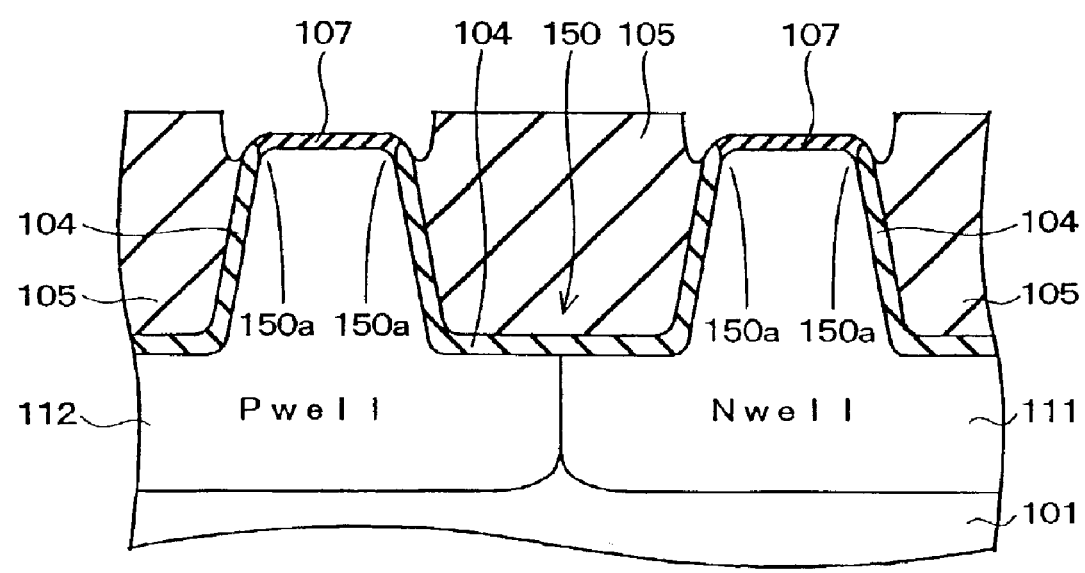
Figure 23:
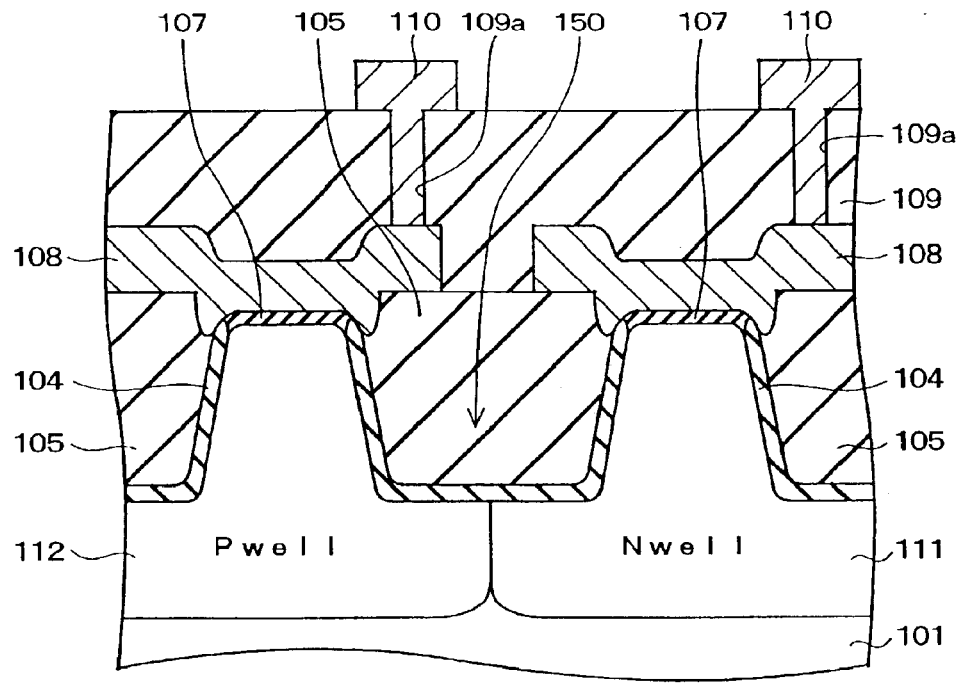
Figure 24:
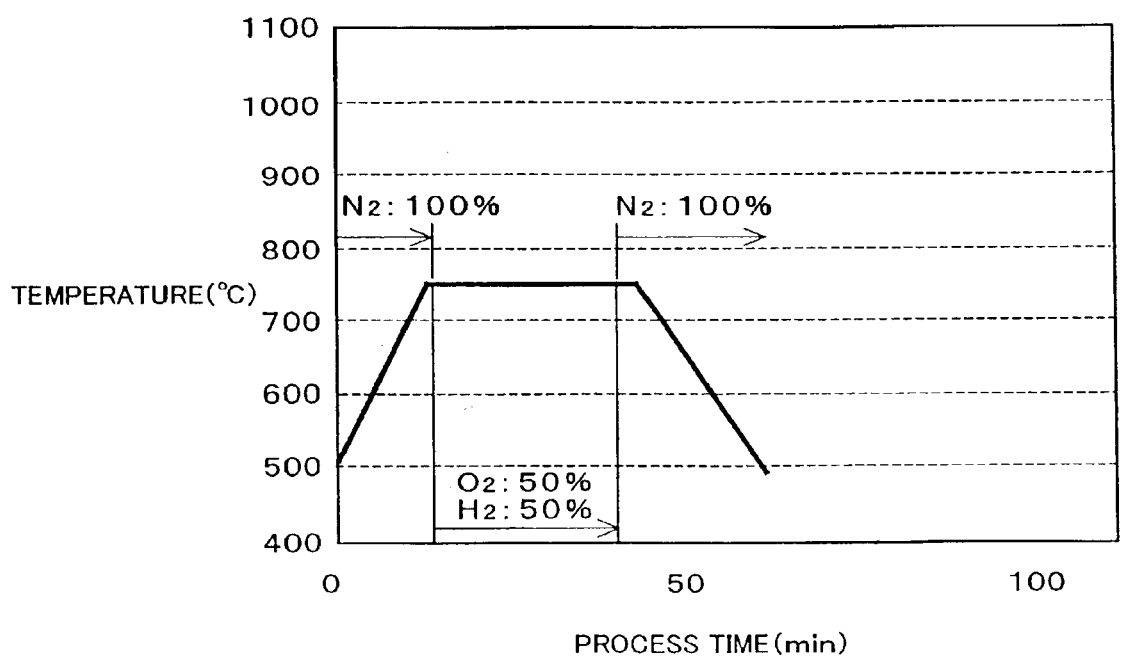
FIG. 24 is a sequence diagram showing conditions for forming a gate insulator film of the conventional MOS transistor.

While the first heat treatment is performed at the temperature less than that causing viscous flow of the gate insulator films while increasing the temperature from about 600° C. to about 800° C. in the aforementioned fourth embodiment, the present invention is not restricted to this but the second heat treatment performed at the temperature exceeding that causing viscous flow of the gate insulator films may also be carried out while increasing the temperature in addition to the first heat treatment, as in a modification of the fourth embodiment shown in FIG. 14.

More specifically, the first heat treatment is performed at a relatively low temperature in a wet oxidizing atmosphere containing about 50 vol. % of $O_2$ gas and about 50 vol. % of $N_2$ gas while increasing the temperature from about 600° C. to about 800° C. as shown in FIG. 14, thereby partially forming gate insulator films of silicon oxide by a thickness of about 4 nm. Thereafter the temperature is increased in an $N_2$ gas atmosphere, which is a non-oxidizing atmosphere, to a level (about 1000° C.) exceeding that causing viscous flow of the gate insulator films. The second heat treatment is performed at a high temperature in a wet oxidizing atmosphere containing about 10 vol. % of $O_2$ gas, about 10 vol. % of $H_2$ gas and about 80 vol. % of $N_2$ gas while increasing the temperature from about 1000° C. to about 1100° C., thereby forming the remaining parts of the gate insulator films consisting of silicon oxide by a thickness of about 3 nm. Thus, gate insulator films of silicon oxide having a thickness of about 7 nm in total are formed on element forming regions. In this case, both of the first heat treatment and the second heat treatment can be performed while increasing the temperature, whereby the oxidation process time can be further reduced as compared with the fourth embodiment.

While the inventive method of forming an insulator film by two stages of first heat treatment and second heat treatment is applied to a step of forming gate insulator films in each of the aforementioned second to fourth embodiments, the present invention is not restricted to this but may alternatively be applied to another insulator film forming step such as a step of forming sacrifice oxide films or liner oxide films.

While gate insulator films (insulator films) are formed on the main surface of a silicon substrate (semiconductor layer) in each of the aforementioned first to fourth embodiments, the present invention is not restricted to this but the gate insulator films (insulator films) may alternatively be formed on the main surface of a silicon layer (semiconductor layer) formed on a substrate. In this case, the silicon layer corresponds to the "semiconductor layer" in the present invention. In other words, the term "semiconductor layer" employed in relation to the present invention indicates a wide concept including a semiconductor substrate and a semiconductor layer formed on a substrate.

What is claimed is:

1. A method of fabricating a semiconductor device comprising steps of:

forming an element isolation trench on the main surface of a semiconductor layer, forming an insulator film constituting a gate insulator film on an upper surface and a side surface of an upper corner of said element isolation trench by heat treatment, and forming a gate electrode to cover the upper surface and the side surface of said upper corner of said element isolation trench interposed said insulator film therebetween, wherein said step of forming said insulator film includes a step of performing said heat treatment on the upper surface and the side surface of said upper corner of said element isolation trench in an atmosphere containing oxidizing gas at a temperature causing viscous flow of said insulator film.

2. The method of fabricating a semiconductor device according to claim 1, wherein said step of forming said insulator film includes steps of:

performing first heat treatment on the upper surface and the side surface of said upper corner of said element isolation trench in an atmosphere containing oxidizing gas at a temperature not causing viscous flow of said insulator film, and performing second heat treatment in an atmosphere containing oxidizing gas at a temperature causing viscous flow of said insulator film after said first heat treatment.

3. The method of fabricating a semiconductor device according to claim 1, wherein said step of forming said insulator film includes a step of performing said heat treatment in an atmosphere containing oxidizing gas, comprising hydrogen, oxygen and nitrogen, at a temperature causing viscous flow of said insulator film thereby forming said insulator film on the upper surface and the side surface of said upper corner of said element isolation trench.

4. The method of fabricating a semiconductor device according to claim 1, wherein said temperature causing viscous flow of said insulator film is at least about 1000° C.

5. A method of fabricating a semiconductor device comprising steps of:

forming an element isolation trench on the main surface of a semiconductor layer, forming an insulator film constituting a gate insulator film on an upper surface and a side surface of an upper corner of said element isolation trench by heat treatment, and forming a gate electrode to cover the upper surface and the side surface of said upper corner of said element isolation trench interposed said insulator film therebetween, wherein said step of forming said insulator film includes steps of:

performing first heat treatment on the upper surface and the said surface of said upper corner of said element isolation trench in an atmosphere containing oxidizing gas at a temperature not causing viscous flow of said insulator film, and performing second heat treatment on the upper surface and the side surface of said upper corner of said element isolation trench in an atmosphere containing oxidizing gas at a temperature causing viscous flow of said insulator film after said first heat treatment.

6. The method of fabricating a semiconductor device according to claim 5, wherein said step of forming said insulator film includes a step of forming a portion having a first thickness less than half the thickness of said insulator film by said first heat treatment and thereafter forming a portion having a second thickness larger than half the thickness of said insulator film by said second heat treatment.

7. The method of fabricating a semiconductor device according to claim 5, wherein said step of forming said insulator film includes a step of forming a portion having a third thickness larger than half the thickness of said insulator film by said first heat treatment and thereafter forming a portion having a fourth thickness less than half the thickness of said insulator film by said second heat treatment.

8. The method of fabricating a semiconductor device according to claim 5, further comprising a step of exposing the surface of said semiconductor layer in advance of said step of forming said insulator film, for forming said insulator film with a thickness of not more than 2.5 nm by carrying out said steps of exposing the surface of said semiconductor layer and forming said insulator film in a vacuum.

9. The method of fabricating a semiconductor device according to claim 5, wherein said step of forming said insulator film includes a step of performing said heat treatment in an atmosphere containing oxidizing gas, comprising hydrogen, oxygen and nitrogen, at a temperature causing viscous flow of said insulator film thereby forming said insulator film on the upper surface and the side surface of said upper corner of said element isolation trench.

10. The method of fabricating a semiconductor device according to claim 5, further comprising a step of increasing the temperature stepwise from said temperature not causing viscous flow of said insulator film employed in said first heat treatment to said temperature causing viscous flow of said insulator film for performing said second heat treatment in a non-oxidizing atmosphere after said first heat treatment.

11. The method of fabricating a semiconductor device according to claim 5, wherein the content of said oxidizing gas in said second heat treatment is smaller than the content of said oxidizing gas in said first heat treatment.

12. The method of fabricating a semiconductor device according to claim 5, wherein said step of performing said first treatment includes a step of oxidizing the upper surface and the side surface of said upper corner of said element isolation trench by said first heat treatment while heating the upper surface and the side surface of said upper corner of said element isolation trench under said atmosphere containing said oxidizing gas at a temperature not causing viscous flow of said insulator film.

13. The method of fabricating a semiconductor device according to claim 5, wherein said step of performing said second heat treatment includes a step of oxidizing the upper surface and the side surface of said upper corner of said element isolation trench by said second heat treatment while heating the upper surface and the side surface of said upper corner of said element isolation trench under said atmosphere containing said oxidizing gas at a temperature causing viscous flow of said insulator film.

14. The method of fabricating a semiconductor device according to claim 5, wherein said step of performing said first heat treatment includes a step of oxidizing the upper surface and the side surface of said upper corner of said element isolation trench by said first heat treatment while heating the upper surface and the side surface of said upper corner of said element isolation trench under said atmosphere containing said oxidizing gas at a temperature not causing viscous flow of said insulator film, and said step of performing said second heat treatment includes a step of oxidizing the upper surface and the side surface of said upper corner of said element isolation trench by said second heat treatment while heating the upper surface an the side surface of said upper corner of said element isolation trench under said atmosphere containing said oxidizing gas at a temperature causing viscous flow of said insulator film.

15. The method of fabricating a semiconductor device according to claim 5, wherein said temperature causing viscous flow of said insulator film is at least about 1000° C.

* * * * *